United States Patent
Oshiyama et al.

(10) Patent No.: US 7,374,829 B2
(45) Date of Patent: *May 20, 2008

(54) ORGANIC ELECTROLUMINESCENT ELEMENT AND FULL COLOR DISPLAY

(75) Inventors: Tomohiro Oshiyama, Hachioji (JP); Taketoshi Yamada, Saitama (JP); Motoi Kinoshita, Hachioji (JP); Hiroshi Kita, Hachioji (JP)

(73) Assignee: Konica Corporation (JP)

( * ) Notice: Subject to any disclaimer, the term of this patent is extended or adjusted under 35 U.S.C. 154(b) by 521 days.

This patent is subject to a terminal disclaimer.

(21) Appl. No.: 10/960,999

(22) Filed: Oct. 7, 2004

(65) Prior Publication Data

US 2005/0048319 A1  Mar. 3, 2005

Related U.S. Application Data

(62) Division of application No. 10/167,120, filed on Jun. 10, 2002, now Pat. No. 6,855,438.

(30) Foreign Application Priority Data

Jun. 15, 2001 (JP) ............................. 2001-181543

(51) Int. Cl.
   *H01L 51/54* (2006.01)
(52) U.S. Cl. .................... 428/690; 428/917; 313/504; 313/506; 257/40; 257/E51.044; 257/E51.051
(58) Field of Classification Search .................... None
   See application file for complete search history.

(56) References Cited

U.S. PATENT DOCUMENTS

| 6,635,364 B1 | 10/2003 | Igarashi ...................... 428/690 |
| 6,855,438 B2 * | 2/2005 | Oshiyama et al. .......... 428/690 |
| 2002/0028329 A1 | 3/2002 | Ise et al. ..................... 428/336 |
| 2002/0041979 A1 | 4/2002 | Taguchi ...................... 428/690 |
| 2002/0045061 A1 | 4/2002 | Hosokawa .................. 428/690 |
| 2002/0074935 A1 | 6/2002 | Kwong et al. .............. 313/504 |
| 2002/0106531 A1 | 8/2002 | Naito .......................... 428/690 |
| 2004/0023060 A1 * | 2/2004 | Kim et al. ................... 428/690 |

FOREIGN PATENT DOCUMENTS

| EP | 0 952 200 | 10/1999 |
| EP | 1 013 740 | 6/2000 |
| JP | 2001 192651 | 7/2001 |
| WO | WO 00/57676 | 9/2000 |

OTHER PUBLICATIONS

European Search Report for 02254090.0-1235, mailed Mar. 28, 2007, 3 pgs.

* cited by examiner

*Primary Examiner*—Marie Yamnitzky
(74) *Attorney, Agent, or Firm*—Squire, Sanders & Dempsey L.L.P.

(57) ABSTRACT

A organic electroluminescent element is disclosed which comprises a light emission layer containing a fluorescent compound and a phosphorescent compound, the fluorescent compound having a nitrogen atom number to carbon atom number ratio in the molecule (N/C) of from 0 to 0.05, wherein the maximum emission wavelength of light emitted according to electroluminescence of the element is longer than the maximum fluorescence wavelength of the Fluorescent compound.

16 Claims, 1 Drawing Sheet

ORGANIC ELECTROLUMINESCENT ELEMENT AND FULL COLOR DISPLAY

This is a Divisional Application of parent application U.S. Ser. No. 10/167,120, filed on Jun. 10, 2002, now U.S. Pat. No. 6,855,438, and hereby incorporates by reference the entire disclosure of the parent.

FIELD OF THE INVENTION

This invention relates to an organic electroluminescent (hereinafter referred to also as EL) element, and a display, and particularly to an organic electroluminescent element excellent in the luminance of emitted light-and a display comprising the organic electroluminescent element.

BACKGROUND OF THE INVENTION

As an emission type electronic displaying device, there is an electroluminescence device (ELD). As materials constituting the ELD, there is an inorganic electroluminescent element or an organic electroluminescent element. The inorganic electroluminescent element has been used for a plane-shaped light source, but a high voltage alternating current has been required to drive the element. An organic electroluminescent element has a structure in which a light emission layer containing a light emission compound is arranged between a cathode and an anode, and an electron and a positive hole were injected into the light emission layer and recombined to form an exciton. The element emits light, utilizing light (fluorescent light or phosphorescent light) generated by deactivation of the exciton, and the element can emit light by applying a relatively low voltage of from several to several decade volts. Further, the element has a wide viewing angle and a high visuality since the element is of self light emission type, and the element is a complete solid element, and the element is noted from the viewpoint of space saving and portability.

However, in the organic EL element for practical use, an organic EL element is required which efficiently emits light with high luminance at a lower power.

In U.S. Pat. No. 3,093,796, there is disclosed an element with long lifetime emitting light with high luminance in which stilbene derivatives, distyrylarylene derivatives or tristyrylarylene derivatives are doped with a slight amount of a fluorescent compound.

An element is known which comprises an organic light emission layer containing an 8-hydroxyquinoline aluminum complex as a host compound doped with a slight amount of a fluorescent compound (Japanese Patent O.P.I. Publication No. 63-264692), and an element is known which comprises an organic light emission layer containing an 8-hydroxyquinoline aluminum complex as a host compound doped with a quinacridone type dye (Japanese Patent O.P.I. Publication No. 3-255190).

When light emitted through excited singlet state is used, the upper limit of the external quantum efficiency (next) is considered to be at most 5%, as the generation ratio of singlet excited species to triplet excited species is 1:3, that is, the generation probability of excited species capable of emitting light is 25%, and further, external light emission efficiency is 20%. Since an organic EL element, employing phosphorescence through the excited triplet, was reported by Princeton University (M. A. Baldo et al., Nature, 403, 17, p. 151-154 (1998)), study on materials emitting phosphorescence at room temperature has been actively made. As the upper limit of the internal quantum efficiency of the excited triplet is 100%, the light emission efficiency of the excited triplet is theoretically four times that of the excited singlet. Accordingly, light emission employing the excited triplet exhibits the same performance as a cold cathode tube, and can be applied to illumination.

It is necessary that when a phosphorescent material is used as a dopant, the maximum wavelength of light which a host compound emits, be in the region shorter than the maximum wavelength of light which the phosphorescent material emits, but in addition, there exist other requisites to be satisfied.

Several proposals with respect to the phosphorescent material were made in "The $10^{th}$ International Workshop On Inorganic and Organic Electroluminescence (EL '00, Hamamatsu). For example, Ikai et al. use, a hole transporting compound as a dopant of a phosphorescent material, M. E. Tompson et al. use, as a host compound of a phosphorescent material, various kinds of electron transporting compounds, which are doped with a new iridium complex, and Tsutsui et al. obtain high light emission efficiency due to introduction of a hole blocking layer.

The host compounds of phosphorescent compounds are disclosed in for example, C. Adachi et al., "Appl. Phys. Lett., 77, pp. 904 (2000)", but an approach from a new aspect with respect to characteristics required in the host compounds is necessary to obtain an organic electroluminescent element emitting light with high luminance.

SUMMARY OF THE INVENTION

The present invention has been made in order to improve emission luminance. An object of the present invention is to provide an organic electroluminescent element emitting light with high emission luminance, and a display employing the organic electroluminescent element which emits light with high emission luminance at reduced power consumption.

DETAILED DESCRIPTION OF THE INVENTION

Figure 1:
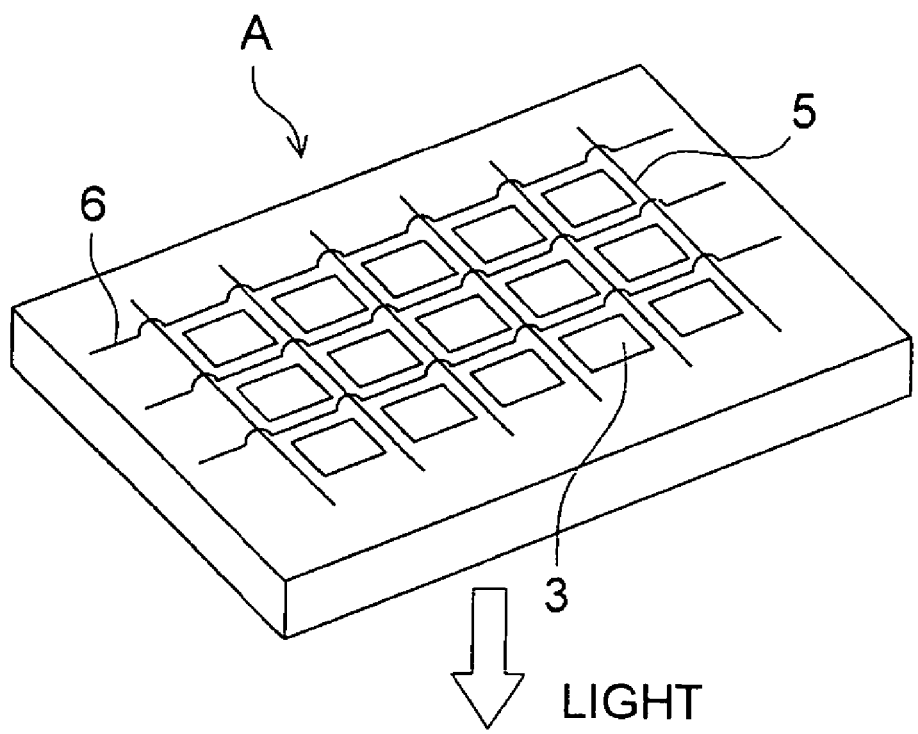
FIG. 1 is a schematic drawing of a displaying section of a full color display employing an active matrix system.

The object of the invention has been attained by the following constitutions:

1. An organic electroluminescent element comprising a light emission layer containing a fluorescent compound and a phosphorescent compound, the fluorescent compound having a nitrogen atom number to carbon atom number ratio in the molecule (N/C) of from 0 to 0.05, wherein the maximum emission wavelength of light emitted according to electroluminescence of the element is longer than the maximum fluorescence wavelength of the fluorescent compound.

2. The organic electroluminescent element of item 1, wherein the nitrogen atom number to carbon atom number ratio (N/C) in the fluorescent compound molecule is in the range of from 0 to 0.03.

3. An organic electroluminescent element comprising a light emission layer containing a fluorescent compound and a phosphorescent compound, the fluorescent compound having a nitrogen atom number to carbon atom number ratio in the molecule (N/C) of from more than 0 to less than 0.05, wherein the maximum emission wavelength of light emitted according to electroluminescence of the element is longer than the maximum fluorescence wavelength of the fluorescent compound.

4. The organic electroluminescent element of item 3, wherein the fluorescent compound has a nitrogen atom number to carbon atom number ratio in the molecule (N/C) of from more than 0 to 0.03.

5. The organic electroluminescent element of items 1 to 4, wherein the maximum fluorescence wavelength of the fluorescent compound is in the range of from 350 to 440 nm.

6. The organic electroluminescent element of items 1 to 4, wherein the molecular weight of the fluorescent compound is not less than 600.

7. The organic electroluminescent element of items 1 to 4, wherein the phosphorescent compound has a phosphorescent quantum yield of not less than 0.01 at 25° C. in its solution.

8. The organic electroluminescent element of items 1 to 4, wherein a hole transporting layer containing at least one fluorescent compound or an electron transporting layer containing at least one fluorescent compound is provided adjacent to the light emission layer, the maximum fluorescence wavelength of the fluorescent compound being in the range of from 350 to 440 nm.

9. The organic electroluminescent element of items 1 to 4, wherein the maximum fluorescence wavelength of the fluorescent compound is in the range of from 390 to 410 nm.

10. The organic electroluminescent element of item 8, wherein the maximum fluorescence wavelength of the fluorescent compound contained in the light emission layer and the hole transporting layer or the electron transporting layer is in the range of from 390 to 410 nm.

11. The organic electroluminescent element of items 1 to 4, wherein the organic electroluminescent element further comprises a cathode, and at least one cathode buffer layer is provided between the light emission layer and the cathode.

12. The organic electroluminescent element of items 1 to 4, wherein the phosphorescent compound is a heavy metal complex compound.

13. The organic electroluminescent element of items 1 to 4, wherein the phosphorescent compound is a metal complex having a metal belonging to a group VIII. of the periodic table as a center metal.

14. The organic electroluminescent element of items 1 to 4, wherein the phosphorescent compound is an osmium complex, an iridium complex or a platinum complex.

15. The organic electroluminescent element of items 1 to 4, wherein the element further comprises a fluorescent compound having a maximum fluorescence wavelength in the region longer than a maximum phosphorescence wavelength of the phosphorescent compound.

16. An organic electroluminescent element comprising a light emission layer containing a fluorescent compound and a phosphorescent compound, the maximum emission wavelength of light emitted according to electroluminescence of the element being longer than the maximum fluorescence wavelength of the fluorescent compound, wherein the fluorescent compound is represented by the following formula (I):

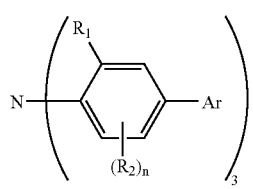

formula (I)

wherein $R_1$ and $R_2$ independently represent a substituent; Ar represents an aromatic hydrocarbon ring or an aromatic heterocyclic ring, provided that each ring may have a substituent; and n is an integer of from 0 to 3.

17. An organic electroluminescent element comprising a light emission layer containing a fluorescent compound and a phosphorescent compound, the maximum emission wavelength of light emitted according to electroluminescence of the element being longer than the maximum fluorescence wavelength of the fluorescent compound, wherein the fluorescent compound is represented by the following formula (II):

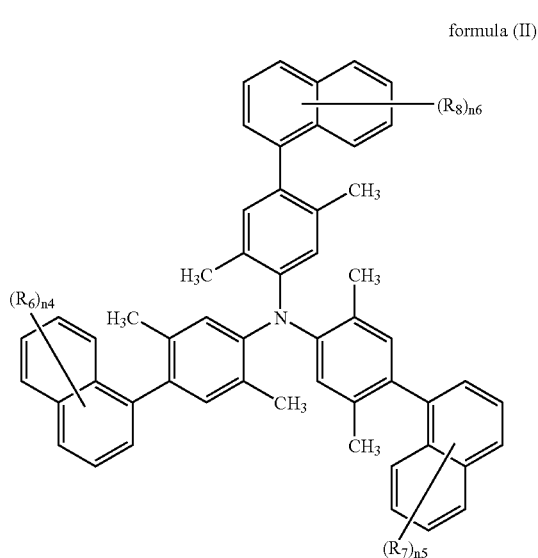

formula (II)

wherein $R_6$, $R_7$ and $R_8$ independently represent a substituent selected from an alkyl group, a cycloalkyl group, an aryl group, a halogen atom, an alkoxy group, an aryloxy group and a heterocyclic group; and n4, n5 and n6 independently represent an integer of from 0 to 7.

18. An organic electroluminescent element comprising a light emission layer containing a fluorescent compound and a phosphorescent compound, the maximum emission wavelength of light emitted according to electroluminescence of the element being longer than the maximum fluorescence wavelength of the fluorescent compound, wherein the fluorescent compound is represented by the following formula (III):

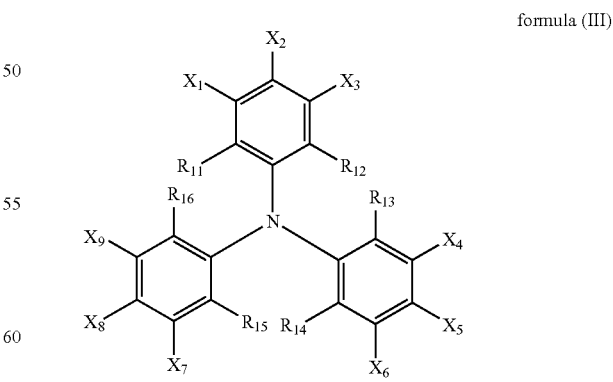

formula (III)

wherein $R_{11}$ through $R_{16}$, and $X_1$ through $X_9$ independently represent a hydrogen atom or a substituent, and may be the same or different, provided that the following expression is satisfied:

$Es_{R11}+Es_{R12}+Es_{R13}+Es_{R14}+Es_{R15}+Es_{R16} \leq -2.0$ wherein $Es_{R11}$, $Es_{R12}$, $Es_{R13}$, $Es_{R14}$, $Es_{R15}$ and $Es_{R16}$ represent the steric parameter of $R_{11}$, $R_{12}$, $R_{13}$, $R_{114}$, $R_{15}$, and $R_{16}$, respectively.

19. An organic electroluminescent element comprising a light emission layer containing a fluorescent compound and a phosphorescent compound, the maximum emission wavelength of light emitted according to electroluminescence of the element being longer than the maximum fluorescence wavelength of the fluorescent compound, wherein the fluorescent compound is represented by the following formula (IV):

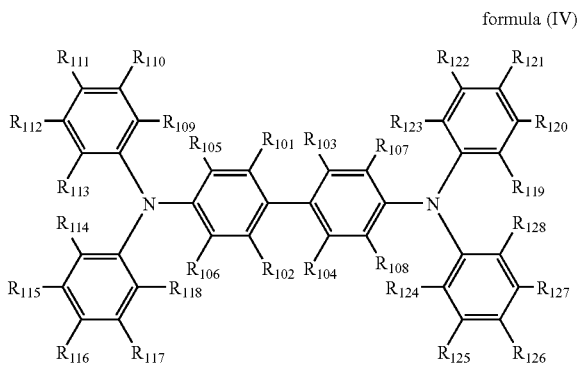

formula (IV)

wherein $R_{101}$ through $R_{128}$ independently represent a hydrogen atom or a substituent, provided that at least one of $R_{101}$ through $R_{104}$ represents a substituent.

20. An organic electroluminescent element comprising a light emission layer containing a fluorescent compound and a phosphorescent compound, the maximum emission wavelength of light emitted according to electroluminescence of the element being longer than the maximum-fluorescence wavelength of the fluorescent compound, wherein the fluorescent compound is represented by the following formula (V):

formula (V)

wherein $R_{201}$ through $R_{206}$ independently represent a hydrogen atom or a substituent.

21. The organic electroluminescent element of items 16 to 20, wherein the nitrogen atom number to carbon atom number ratio (N/C) in the molecule of the fluorescent compound represented by formula (I), (II), (III), (IV), or (V) is in the range of from 0 to 0.05.

22. The organic electroluminescent element of items 16 to 20, wherein the nitrogen atom number to carbon atom number ratio (N/C) in the molecule of the fluorescent compound represented by formula (I), (II), (III), (IV), or (V) is in the range of from more than 0 to less than 0.05.

23. The organic electroluminescent element of items 16 to 20, wherein the phosphorescent compound is a heavy metal complex compound.

24. The organic electroluminescent element of items 16 to 20, wherein the phosphorescent compound is a metal complex compound having a metal belonging to a group VIII of the periodic table as a center metal.

25. The organic electroluminescent element of items 16 to 20, wherein the phosphorescent compound is an osmium complex, an iridium complex or a platinum complex.

26. The organic electroluminescent element of items 16 to 20, wherein the element further comprises a fluorescent compound having a maximum fluorescence wavelength in the region longer than a maximum phosphorescence wavelength of the phosphorescent compound.

27. A display comprising the organic electroluminescent element of any one of items 1 through 26.

28. A full color display comprising two of the organic electroluminescent element of any one of items 1 through 26, wherein the two elements are arranged on the same substrate, and emit light having a maximum emission wavelength different from each other.

101. An organic electroluminescent element comprising a light emission layer containing a fluorescent compound and a phosphorescent compound, the fluorescent compound having a nitrogen atom number to carbon atom number ratio (N/C) in the molecule of from 0 to 0.05, wherein the maximum emission wavelength of light emitted according to electroluminescence of the element is longer than the maximum fluorescence wavelength of the fluorescent compound.

102. The organic electroluminescent element of item 101, wherein the maximum fluorescence wavelength of the fluorescent compound is in the range of from 350 to 440 nm.

103. The organic electroluminescent element of item 101 or 102, wherein the nitrogen atom number to carbon atom number ratio (N/C) in the fluorescent compound molecule is in the range of from 0 to 0.03.

104. The organic electroluminescent element of item 101 or 102, wherein the molecular weight of the fluorescent compound is not less than 600.

105. The organic electroluminescent element of any one of items 101 through 104, wherein the phosphorescent compound has a phosphorescent quantum yield of not less than 0.01 at 25° C. in its solution.

106. The organic electroluminescent element of any one of items 101 through 105, wherein a hole transporting layer containing at least one fluorescent compound or an electron transporting layer containing at least one fluorescent compound is provided adjacent to the light emission layer, the maximum fluorescence wavelength of the fluorescent compound being in the range of from 350 to 440 nm.

107. The organic electroluminescent element of any one of items 101 through 105, wherein the maximum fluorescence wavelength of the fluorescent compound is in the range of from 390 to 410 nm.

108. The organic electroluminescent element of item 106, wherein the maximum fluorescence wavelength of the fluorescent compound contained in the light emission layer and the hole transporting layer or the electron transporting layer is in the range of from 390 to 410 nm.

109. The organic electroluminescent element of any one of items 101 through 108, wherein at least one cathode buffer layer is provided between the light emission layer and a cathode.

110. An organic electroluminescent element comprising a light emission layer containing a fluorescent compound and a phosphorescent compound, the maximum emission wavelength of light emitted according to electroluminescence of the element being longer than the maximum fluorescence wavelength of the fluorescent compound, wherein the fluorescent compound is represented by formula (I) as described above.

111. An organic electroluminescent element comprising a light emission layer containing a fluorescent compound and a phosphorescent compound, the maximum emission wavelength of light emitted according to electroluminescence of the element being longer than the maximum fluorescence wavelength of the fluorescent compound, wherein the fluorescent compound is represented by formula (II) as described above.

112. An organic electroluminescent element comprising a light emission layer containing a fluorescent compound and a phosphorescent compound, the maximum emission wavelength of light emitted according to electroluminescence of the element being longer than the maximum fluorescence wavelength of the fluorescent compound, wherein the fluorescent compound is represented by formula (III) as described above.

113. An organic electroluminescent element comprising a light emission layer containing a fluorescent compound and a phosphorescent compound, the maximum emission wavelength of light emitted according to electroluminescence of the element being longer than the maximum fluorescence wavelength of the fluorescent compound, wherein the fluorescent compound is represented by formula (IV) as described above.

114. An organic electroluminescent element comprising a light emission layer containing a fluorescent compound and a phosphorescent compound, the maximum emission wavelength of light emitted according to electroluminescence of the element being longer than the maximum fluorescence wavelength of the fluorescent compound, wherein the fluorescent compound is represented by formula (V) as described above.

115. The organic electroluminescent element of any one of items 110 through 114, wherein the nitrogen atom number to carbon atom number ratio (N/C) in the molecule of the fluorescent compound represented by formula (I), (II), (III), (IV), or (V) is in the range of from 0 to 0.05.

116. The organic electroluminescent element of any one of items 101 through 115, wherein the phosphorescent compound is a heavy metal complex compound.

117. The organic electroluminescent element of item 116, wherein the phosphorescent compound is a metal complex compound containing a metal belonging to a group VIII of the periodic table as a center metal.

118. The organic electroluminescent element of item 116, wherein the phosphorescent compound is an osmium complex, an iridium complex or a platinum complex.

119. The organic electroluminescent element of any one of items 101 through 118, wherein the element further comprises a fluorescent compound having a maximum fluorescence wavelength in the region longer than a maximum phosphorescence wavelength of the phosphorescent compound.

120. A display comprising the organic electroluminescent element of any one of items 101 through 119.

121. A full color display comprising two or more of the organic electroluminescent element of items 101 through 119, wherein the elements are arranged on the same substrate, and emit light having a maximum emission wavelength different from each other.

The present invention will be detailed below.

The present inventors have made an extensive study on a fluorescent compound used as a host compound of a phosphorescent compound, and have found that there exists some relationship between the luminance of emitted light of an electroluminescent element and a nitrogen atom number to carbon atom number ratio (N/C) in a molecule of the host compound contained in the electroluminescent element. As a result, it has been proved that a host compound having a relatively low N/C increases the emitted light luminance. It is considered that the emitted light luminance is restricted by some action of the nitrogen atom which is contained in the molecule of a host compound having a relatively high N/C. Accordingly, in order to increase emitted light luminance of an organic electroluminescent element employing a phosphorescent compound as a dopant, it is effective to reduce an N/C of the phosphorescent compound.

In the invention, the fluorescent compound is a compound in which light is emitted through light excited singlet state in which two electron spins are in reversely parallel with each other, and the phosphorescent compound is a compound in which light is emitted through light excited triplet state in which two electron spins are in parallel with each other. Herein, the phosphorescent compound in the invention is considered to form excited triplet state at room temperature (from 15 to 30° C.) through energy transfer from the exited singlet state or excited triplet state of the fluorescent compound described above. Phosphorescent compounds have been considered to be capable of emitting phosphoresce only at a low temperature such as 77° K. However, since in recent years, compounds capable of emitting phosphoresce at room temperature have been found, many compounds, mainly heavy metal-containing complexes such as iridium complexes, have been synthesized and studied (see for example, S. Lamansky et al, J. Am. Chem. Soc., 123, pp. 4304, 2001).

In the invention, the maximum fluorescence wavelength of the fluorescent compound as a host compound is a wavelength giving the maximum fluorescent intensity in the fluorescent spectra of a 100 nm thick layer of the fluorescent compound deposited on a glass plate.

In the invention, it has been confirmed that the organic electroluminescent element comprising a light emission layer containing a phosphorescent compound and a fluorescent compound having a nitrogen atom number/carbon atom number ratio (N/C) in the molecule of from 0 to 0.05 emits light with high luminance. Accordingly, in the invention, the fluorescent compound as a host compound, which is used in combination with a phosphorescent compound, is preferably a compound having in its molecule an N/C of from 0 to 0.05. Although the reason is not completely elucidated, as described above, it is considered that luminance of emitted light is restricted by some action of the nitrogen atom which is contained in the molecule of a host compound having a relatively high N/C.

Further, in the invention, a fluorescent compound as a host compound having in the molecule an N/C of from 0 to 0.03 is preferably used in combination with a phosphorescent compound in that lifetime of emitted light is longer. Although the reason is not completely elucidated, it is considered that in order to obtain relatively long lifetime of emitted light, the use of a host compound having a nitrogen atom is preferable but the use of a host compound having an N/C not less than a certain value restricts the lifetime due to some action of the nitrogen atom.

In the invention, the phosphorescent maximum wavelength of the phosphorescent compound as a dopant contained in the light emission-layer is longer than the maximum fluorescence wavelength of the fluorescent compound as a host compound, whereby an organic electroluminescence (EL) element can be obtained which employs light emission due to excited triplet of the phosphorescent compound as a dopant. Accordingly, the organic electroluminescent element of the invention emits light with an electroluminescent maximum wavelength longer than the maximum fluorescence wavelength of the fluorescent compound (a wavelength giving the maximum fluorescent intensity which is determined from the fluorescent spectra of a layer of the fluorescent compound which is deposited on a glass plate to give a thickness of 100 nm).

In the invention, the maximum fluorescence wavelength of the fluorescent compound used as a host compound is in the range of preferably from 350 to 440 nm, and more preferably from 390 to 410 nm.

A lower organic compound is poor in thermal stability due to its low molecular weight, and may not emit light with sufficiently high luminance. In the invention, the molecular weight of the fluorescent compound as a host compound of the phosphorescent compound is preferably not less than 600 in view of thermal stability.

In the invention, the phosphorescent quantum yield of the phosphorescent compound at 25° C. in its solution is preferably not less than 0.001, more preferably not less than 0.01, and most preferably not less than 0.1.

Next, the measurement means and theory of the quantum yield $\phi_p$ of excited triplet state will be explained.

Energy transition from excited singlet state to the ground state is made at a rate constant of nonradiative transition $k_{sn}$ and at a rate constant $k_f$ of fluorescent radiation $k_f$, whereby excited energy is lost. In addition to this, energy transition from excited singlet state to the excited triplet state is made at a rate constant $K_{isc}$. Herein, lifetime of the excited singlet state $\tau_s$ is defined by the following formula:

$$\tau_s = (k_{sn} + k_f + k_{isc})^{-1}$$

Fluorescent quantum yield $\phi_f$ is represented by the following formula:

$$\phi_f = k_f \tau_s$$

Energy transition from excited triplet state to the ground state is made at a rate constant of nonradiative transition $k_{tn}$ and at a rate constant of phosphorescent radiation $k_p$, whereby excited energy is lost. Herein, lifetime of the excited triplet state $\tau_t$ is defined by the following formula:

$$\tau_t = (k_{tn} + k_p)^{-1}$$

$\tau_t$ is in the range of ordinarily $10^{-6}$ to $10^{-3}$ seconds, but may be up to several seconds.

Employing quantum yield of excited triplet state generation $\phi_{ST}$, phosphorescent quantum yield $\phi_p$ is represented as follows:

$$\phi_p = \phi_{ST} \cdot k_p \tau_t$$

The parameters described above can be measured according to a method described in the fourth edition, Jikken Kagaku Koza 7, Bunko II, p. 398 (1992) (published by Maruzen).

In the invention, the steric parameter Es of the substituent is a substitution constant defined by Taft and described in, for example, "Relation between Structure and Activity of Medicine" extra issue No. 122, Konando. In the invention, Es value is a value based on a hydrogen atom, namely the value of Es(H=0), and calculated by subtracting 1.24 from the value of Es(CH$_3$) based on a methyl group Typical examples of the value are shown in Table 1.

TABLE 1

| Substituent | Es value |
|---|---|
| H | 0 |
| CH$_3$ | −1.24 |
| C$_2$H$_5$ | −1.31 |
| i-C$_3$H$_7$ | −1.71 |
| t-C$_4$H$_9$ | −2.78 |
| F | −0.46 |
| Cl | −0.97 |
| Br | −1.16 |
| CF$_3$ | −2.40 |
| CCl$_3$ | −3.30 |
| OCH$_3$ | −0.55 |
| OH | −0.55 |
| SH | −1.07 |
| CN | −0.51 |

The light emission layer will be detailed below.

The light emission layer herein refers to a layer emitting light when electric current is supplied to an electrode comprised of a cathode and an anode. Typically, the light emission layer is a fluorescent compound-containing layer emitting light when electric current is supplied to an electrode comprised of a cathode and an anode. The organic electroluminescent element (EL element) basically has a structure in which a light emission layer is put between a pair of electrodes. The organic EL element of the invention has a structure in which in addition to the light emission layer, a hole transporting layer, an electron transporting layer, an anode buffer layer or a cathode buffer layer is optionally provided between a cathode and an anode.

In concrete, the following structures are included.

(i) Anode/Light emission layer/Cathode
(ii) Anode/Hole transporting layer/Light emission layer/Cathode
(iii) Anode/Light emission layer/Electron transporting layer/Cathode
(iv) Anode/Hole transporting layer/Light emission layer/Electron transporting layer/Cathode
(v) Anode/Anode buffer layer/Hole transporting layer/Light emission layer/Electron transporting layer/Cathode buffer layer/Cathode As a method of forming a light emission layer employing the compounds mentioned above, there is a known method for forming a thin film such as a deposition method, a spin-coat method, a casting method and an LB method. The light emission layer is preferably a molecular deposit layer. The molecular deposit layer herein refers to a layer formed by deposition of the above compounds in a gaseous state, or to a layer formed by solidification of the compounds in a melted state or a liquefied state. The molecular deposit layer is distinguished from a thin layer (molecular cumulation layer) formed by an LB method by a structural difference, for example, an aggregated structure or a higher order structure, or a functional difference resulting from the structural difference.

Moreover, the light emission layer can be formed by the method such as that described in Japanese Patent O.P.I. Publication No. 57-51781, by which the above compound as a light emission material is dissolved in a solvent together with a binder such as a resin, and the thus obtained solution is formed into a thin layer by a method such as a spin-coat method. Thickness of the emission layer thus formed is not specially restricted. Although the thickness of the layer thus formed is optionally selected, the thickness is preferably within the range of from 5 nm to 5 μm.

The phosphorescent compound in the invention is concretely a heavy metal complex compound, preferably a metal complex compound containing a metal belonging to a group VIII of the periodic table, and more preferably a metal complex compound containing osmium, iridium or platinum.

The phosphorescent compound has a phosphorescent quantum yield in the solution at 25° C. of preferably not less than 0.001 at 25° C., as described above, and has a maximum phosphorescence wavelength longer than a maximum fluorescence wavelength of a fluorescent compound as a host compound. Employing the phosphorescent compound emitting a phosphorescent light with a maximum phosphorescence wavelength longer than a maximum fluorescence wavelength of the fluorescent compound as a host compound, that is, employing phosphorescence emitted by the phosphorescent compound or a triplet state, an EL element can be obtained which emits electroluminescence light having wavelengths longer than a maximum fluorescence wavelength of the fluorescent compound. The maximum phosphorescence wavelength of the phosphorescent compound used is not specifically limited, but the wavelength of emitted light can be theoretically varied selecting a center metal, a ligand or a substituent of the ligand contained in the phosphorescent compound.

For example, employing a fluorescent compound having a maximum fluorescent wavelength in the range of from 350 to 440 nm as a host compound, and an iridium complex compound having a phosphorescent light in a green region, an EL element can be obtained which emits electroluminescence light in the green region.

Examples of the phosphorescent compound used in the invention will be listed below, but are not limited thereto. These compounds can be synthesized according to a method described in for example, Inorg. Chem. 40, 1704-1711.

Ir-1

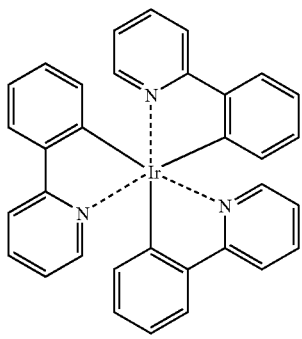

Ir-2

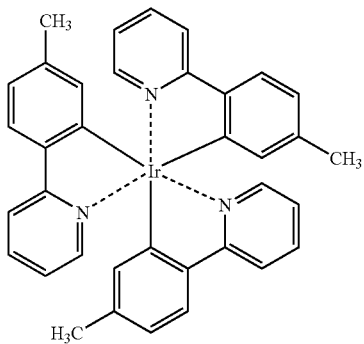

Ir-3

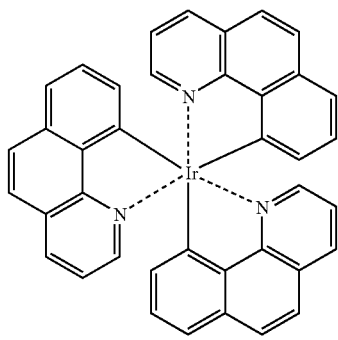

Ir-4

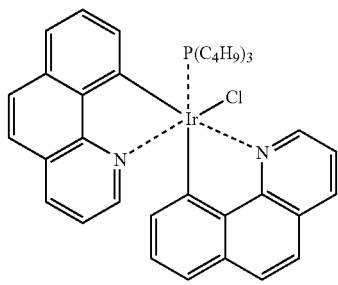

Ir-5

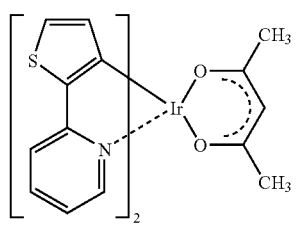

Ir-6

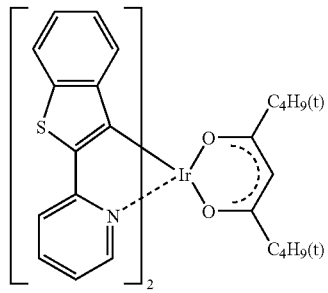

Ir-7

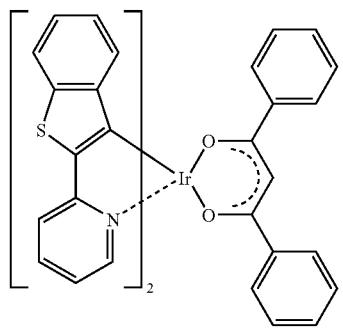

-continued

Ir-8 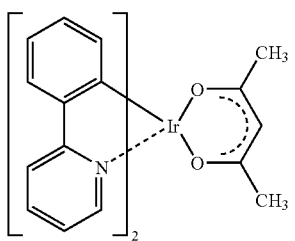

Ir-9 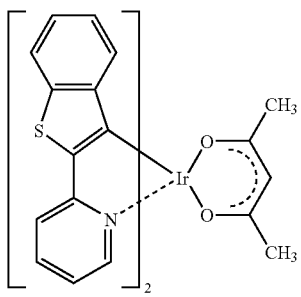

Ir-10 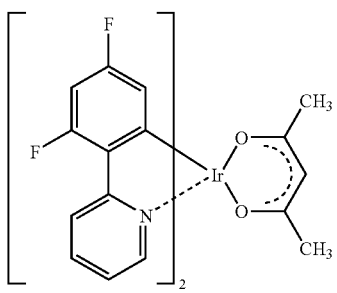

Ir-11 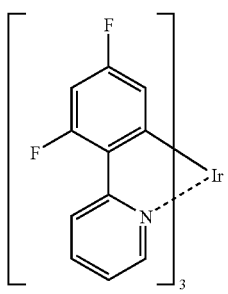

Pt-1 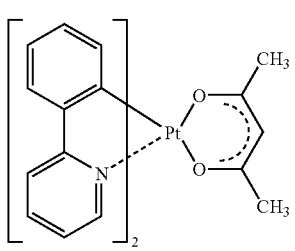

-continued

Pt-2 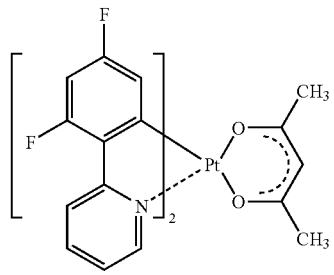

Pt-3 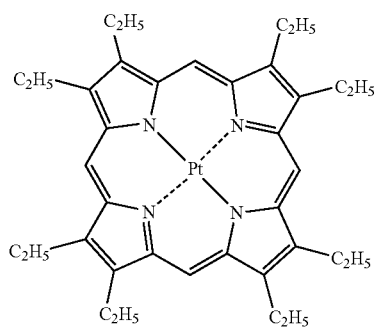

A-1 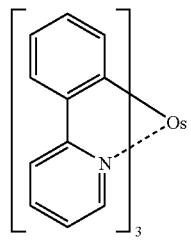

As another embodiment of the invention, there is an organic electroluminescent element comprising, in addition to a fluorescent compound (A) as a host compound and a phosphorescent compound, a fluorescent compound (B) having a phosphorescent maximum wavelength in the wavelength region longer than the maximum wavelength of light emitted by the phosphorescent compound. In this case, the electro-luminescence of the EL element is emitted from the fluorescent compound (B) to which energy is transferred from the fluorescent compound (A) and the phosphorescent compound. The fluorescent compound (B) preferably has a high quantum yield in the for m of solution. Herein, the quantum yield is preferably not less than 10%, and more preferably not less than 30%. Examples of the fluorescent compound (B) include a qumarine dye, a cyanine dye, a chloconium dye, a squalenium dye, an oxobenzanthracene dye, a fluorescene dye, a rhodamine dye, a pyrylium dye, a perylene dye, a stilbene dye, a polythiophene dye, and a fluorescent compound of a rare earth element complex type.

The fluorescent quantum yield herein can be measured according to a method described in the fourth edition, Jikken Kagaku Koza 7, Bunko II, p. 362 (1992) (published by Maruzen). In the invention, tetrahydrofuran is employed as a solvent for measurement.

In the invention, it is preferred that a fluorescent compound, having a nitrogen atom number-to-carbon atom number ratio (N/C) in the molecule of from 0 to 0.05, is used as a host compound in combination with a phosphorescent compound. This can provide an organic EL element having a high luminance and a long emission lifetime, but from another viewpoint, it is useful in the invention to employ the compounds represented by formulae (I) through (V) as a host compound which is used in combination with the phosphorescent compound.

The compounds represented by formulae (I) through (V) in the invention will be explained below.

In formula (I), n is an integer of from 0 to 3, and $R_1$ and $R_2$ independently represent a substituent. The substituent is preferably an alkyl group such as a methyl group, an ethyl group, an i-propyl group, a hydroxyethyl group, a methoxymethyl group, a trifluoromethyl group and a t-butyl group, a halogen atom such as a fluorine atom and a chlorine atom, or an alkoxy group such as a methoxy group, an ethoxy group, an i-propoxy group and a butoxy group. Ar represents an aromatic hydrocarbon ring or an aromatic heterocyclic ring, provided that each may have a substituent, and preferably represents a naphthyl group, a binaphthyl group, a quinolyl group, an iso-quinolyl group, a benzoxazolyl group and a benzimidazolyl group, when n are an integer of 2 or more, plural $R_1$s and $R_2$s each may be the same or different.

In Formula (II), n4, n5 and n6 independently represent an integer of from 0 to 7. $R_6$, $R_7$ and $R_8$ independently represent a substituent selected from an alkyl group, a cycloalkyl group, an aryl group, a halogen atom, an alkoxy group, an aryloxy group and a heterocyclic group; and a methyl group and a naphthyl group are particularly preferred.

When n4, n5 and n6 each are an integer of 2 or more, plural $R_6$s, $R_7$s, and $R_8$s each may be the same or different.

In Formula (III), $R_{11}$ through $R_{16}$, and $X_1$ through $X_9$ independently represent a hydrogen atom or a substituent, and may be the same or different, provided that the sum of $Es_{R11}$ through $Es_{R16}$, which represent the steric parameter of $R_{11}$ through $R_{16}$, respectively, satisfies the following expression:

$$Es_{R11}+Es_{R12}+Es_{R13}+Es_{R14}+Es_{R15}+Es_{R16} \leq -2.0;$$

The adjacent substituents may be condensed with each other to form a ring structure. The substituents represented by $R_{11}$ through $R_{16}$ are preferably a methyl group, an ethyl group, an isopropyl group, a t-butyl group or a trifluoromethyl group. The substituents represented by $X_1$ through $X_9$ are preferably an alkyl group, an aryl group, a heterocyclic group, a halogen atom, an alkoxy group and an amino group.

$X_2$, $X_5$ and $X_8$ each are preferably an aryl group or an amino group, and especially preferably a diarylamino group.

In formula (IV), $R_{101}$ through $R_{128}$ independently represent a hydrogen atom or a substituent, provided that at least one of $R_{101}$ through $R_{104}$ represents a substituent. When $R_{101}$ through $R_{128}$ represent a substituent, the substituent is preferably an alkyl group (for example, a methyl group, an ethyl group, an i-propyl group, a hydroxyethyl group, a methoxymethyl group, a trifluoromethyl group, a perfluoropropyl group, a perfluoro-n-butyl group, a perfluoro-t-butyl group, or a t-butyl group); a cycloalkyl group (for example, a cyclopentyl group and a cyclohexyl group); an aralkyl group (for example, a benzyl group and a 2-phenethyl group); an aryl group (for example, as a phenyl group, a naphthyl group, a p-tolyl group and a p-chlorophenyl group); an alkoxy group (for example, a methoxy group, an ethoxy group, an i-propoxy group and a butoxy group); an aryloxy group (for example, a phenoxy group) or an arylamino group (for example, a diphenylamino group). The foregoing groups further may have a substituent, examples of which include a hydrogen atom, a halogen atom, a trifluoromethyl group, an alkyl group, an aryl group, an alkoxy group, an aryloxy group, an alkylthio group, a dialkylamino group, a dibenzylamino group, and a diarylamino group.

In formula (IV), the substituent represented by $R_{101}$ through $R_{104}$ is preferably an alkyl group, and two or four substituents of $R_{101}$ through $R_{104}$ are more preferably methyl groups.

In formula (V), $R_{201}$, $R_{202}$, $R_{203}$, $R_{204}$, $R_{205}$, and $R_{206}$ independently represent a hydrogen atom, or a substituent. When $R_{201}$ through $R_{206}$ independently represent a substituent, the substituent is preferably those denoted in $R_{101}$ through $R_{128}$ above, more preferably a substituted or unsubstituted aryl group, and most preferably substituted or unsubstituted phenyl group.

Of the compounds represented by formulae (I) through (V), compounds having a nitrogen atom number-to-carbon atom number ratio (N/C) in the molecule of not more than 0.05 are preferable, and compounds having a nitrogen atom number-to-carbon atom number ratio (N/C) in the molecule of not more than 0.03 are more preferable.

Examples of compounds represented by formulae (I) through (V) will be listed below, but are not limited thereto.

(1)

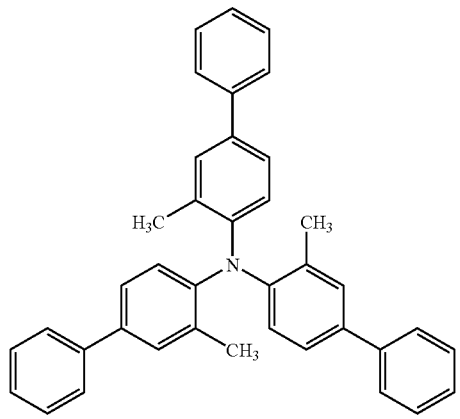

(2)

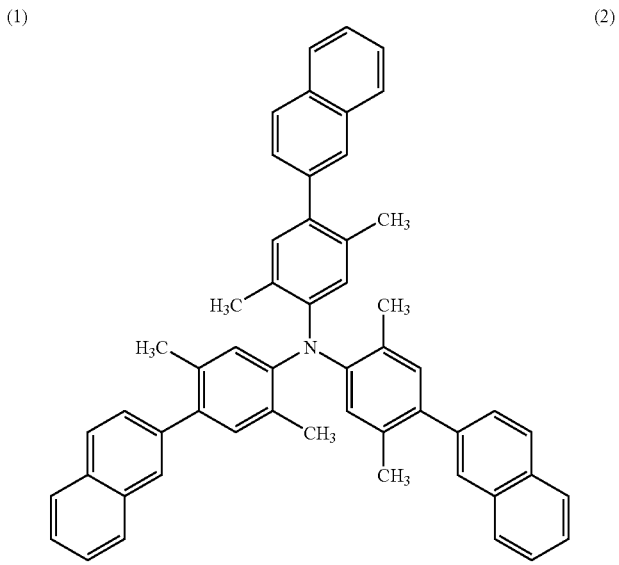

-continued
(3)
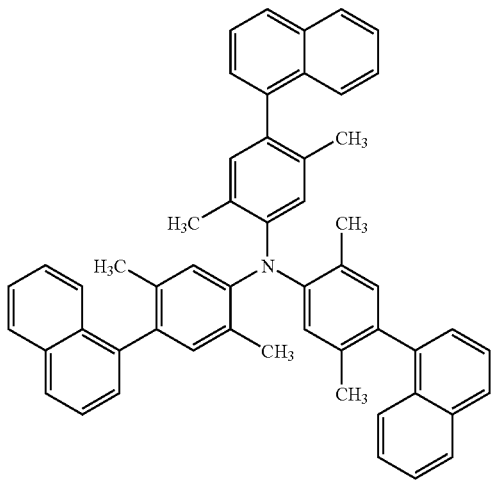
(4)
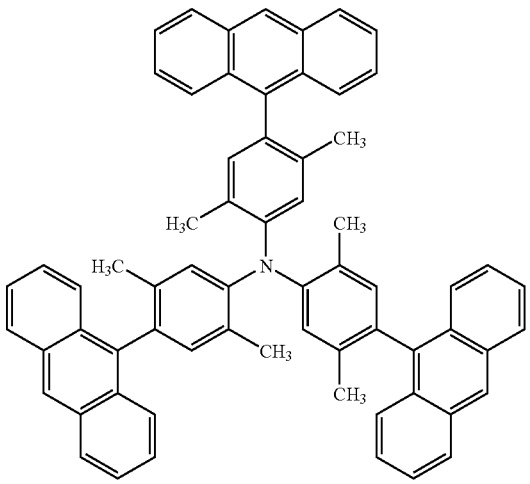
(5)
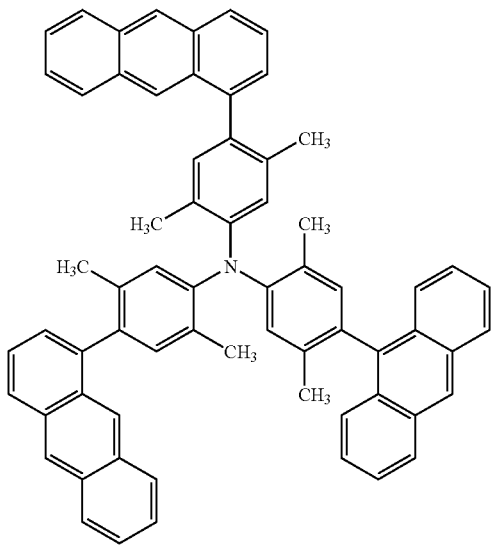
(6)
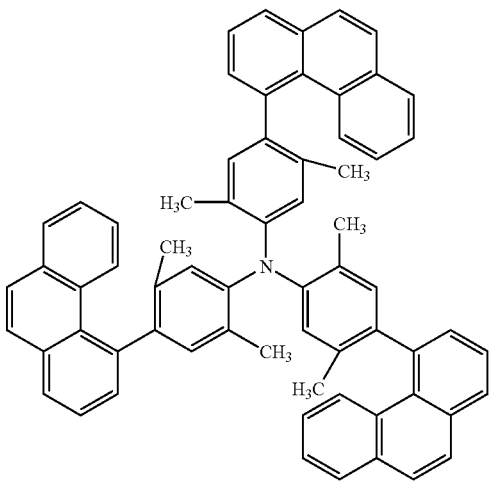
(7)
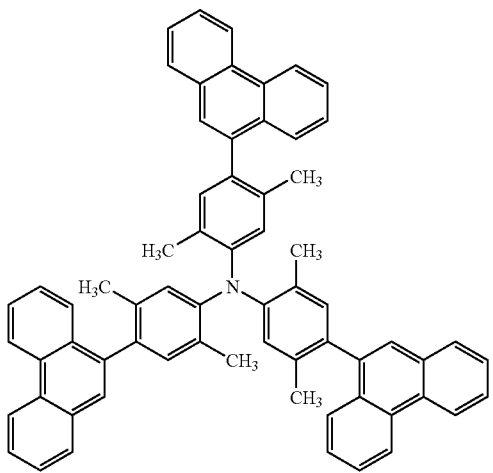
(8)
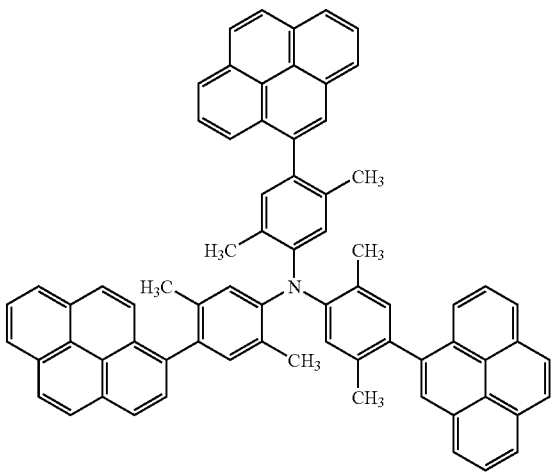

-continued
(9)
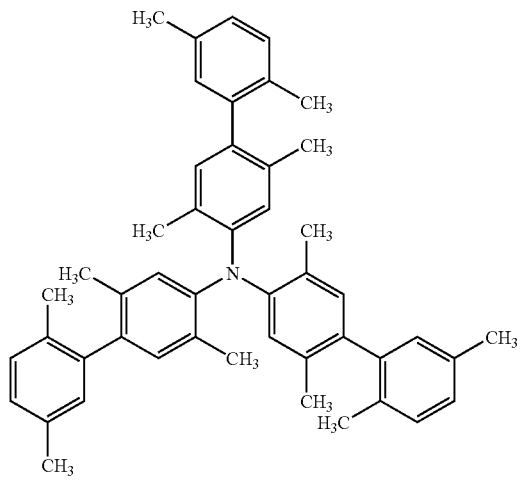
(10)
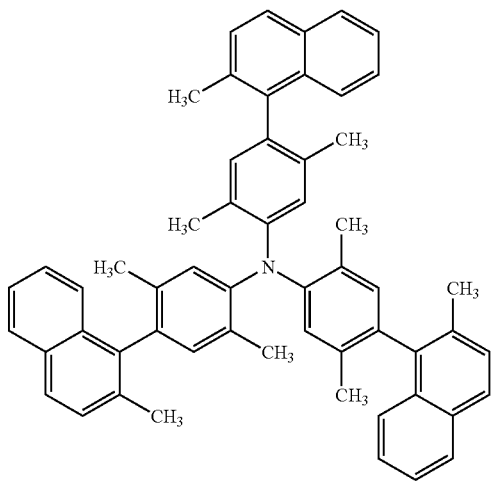
(11)
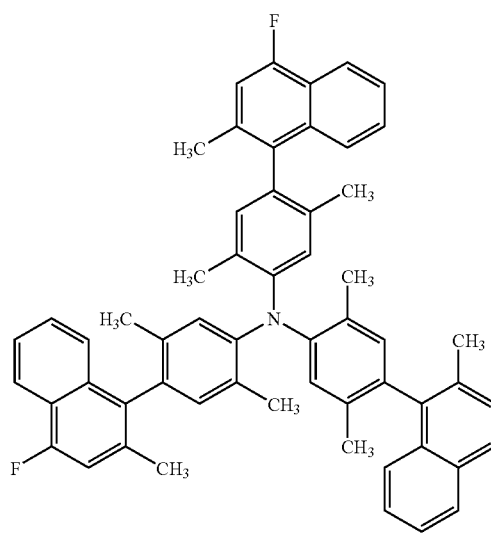
(12)
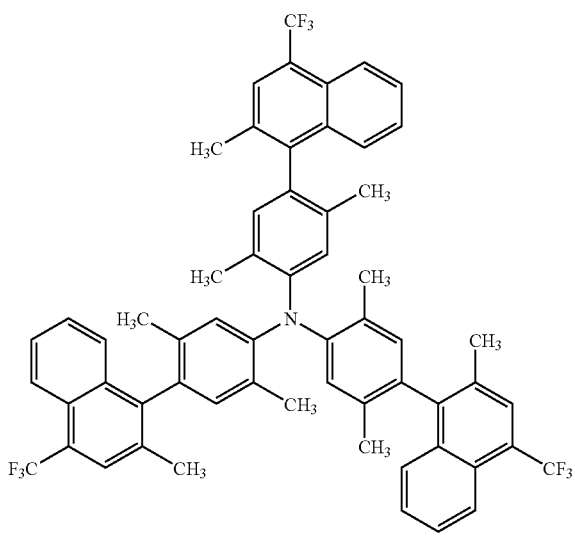
(13)
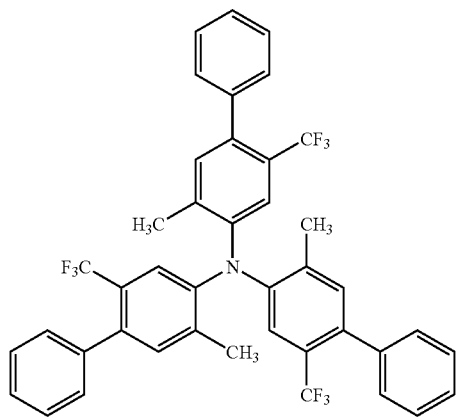
(14)
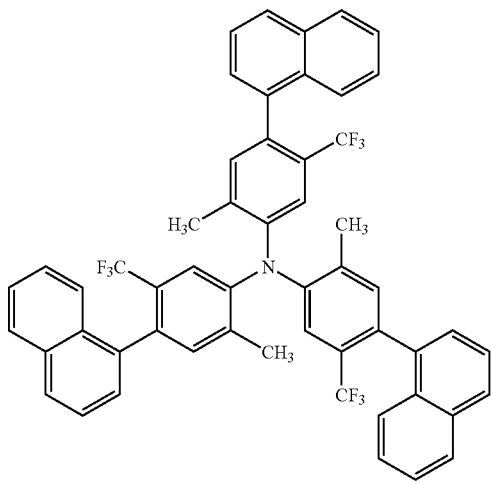

-continued
(15)
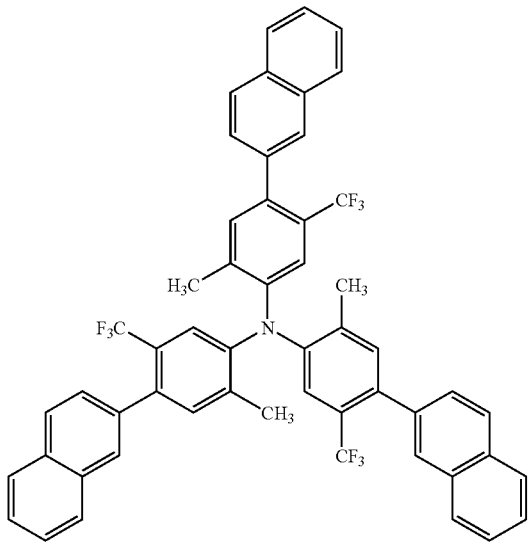
(16)
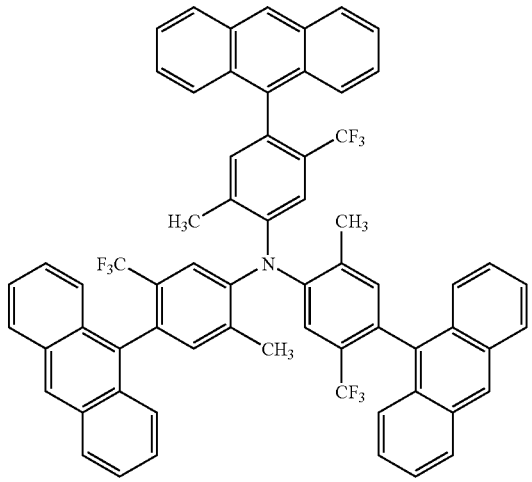
(17)
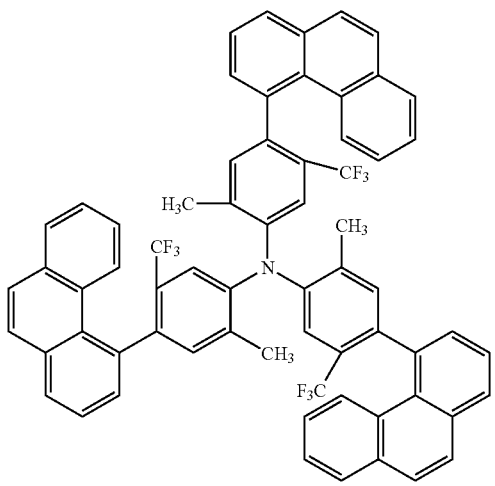
(18)
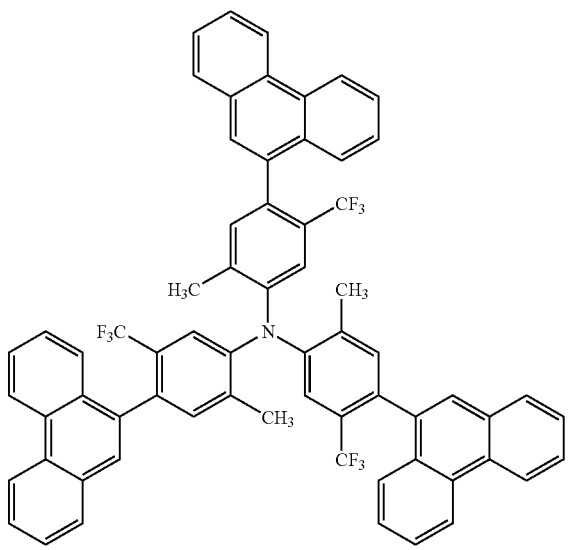
(19)
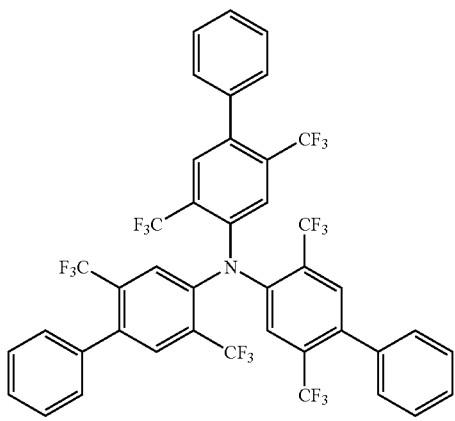
(20)
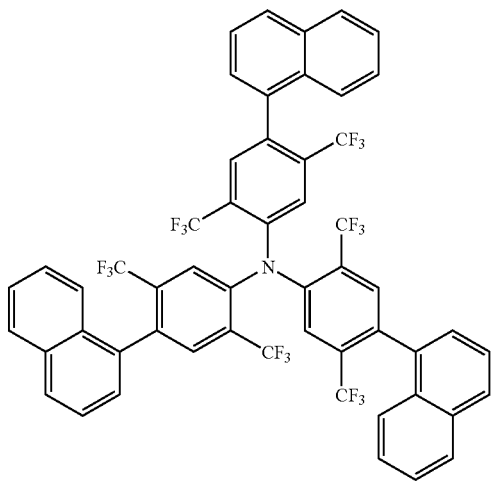

-continued
(21)
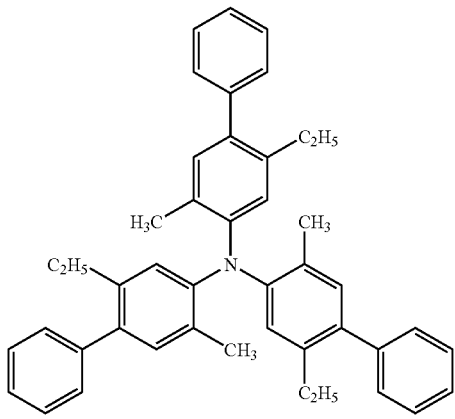
(22)
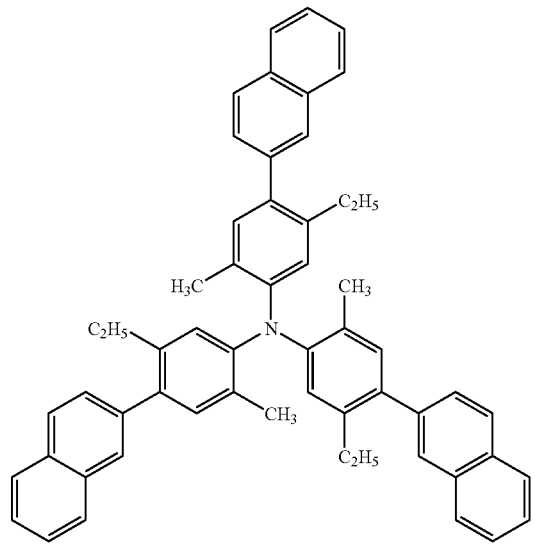
(23)
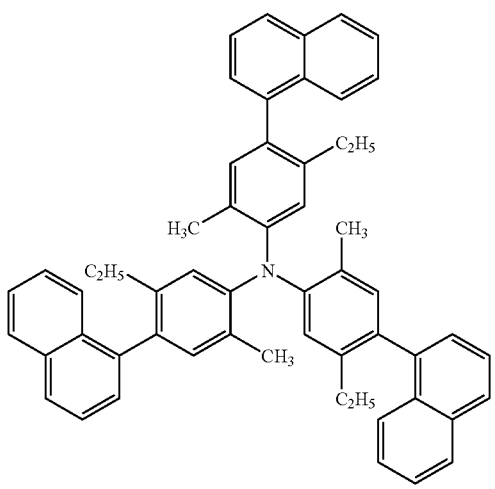
(24)
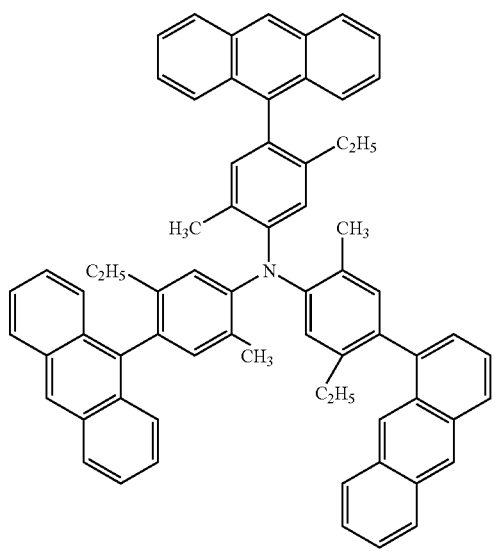
(25)
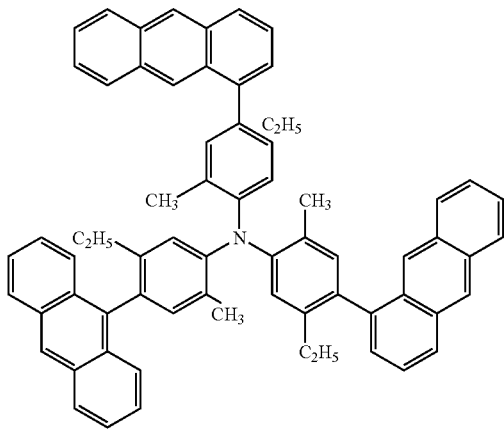
(26)
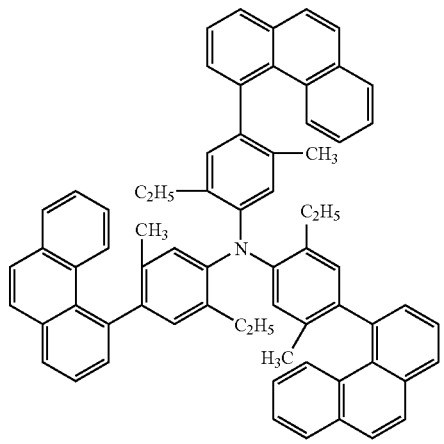

-continued
(27)
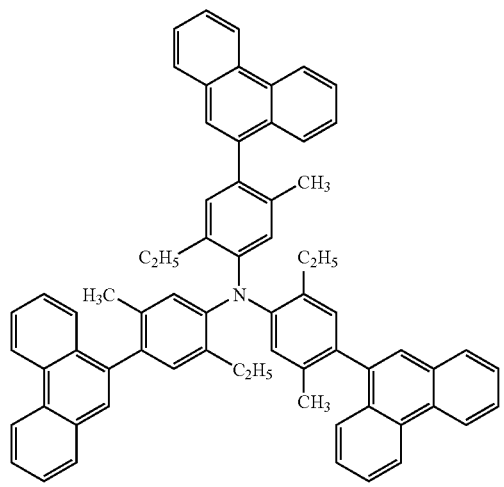
(28)
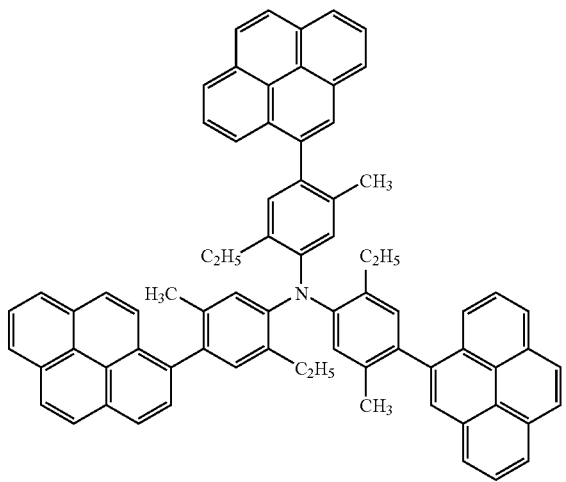
(29)
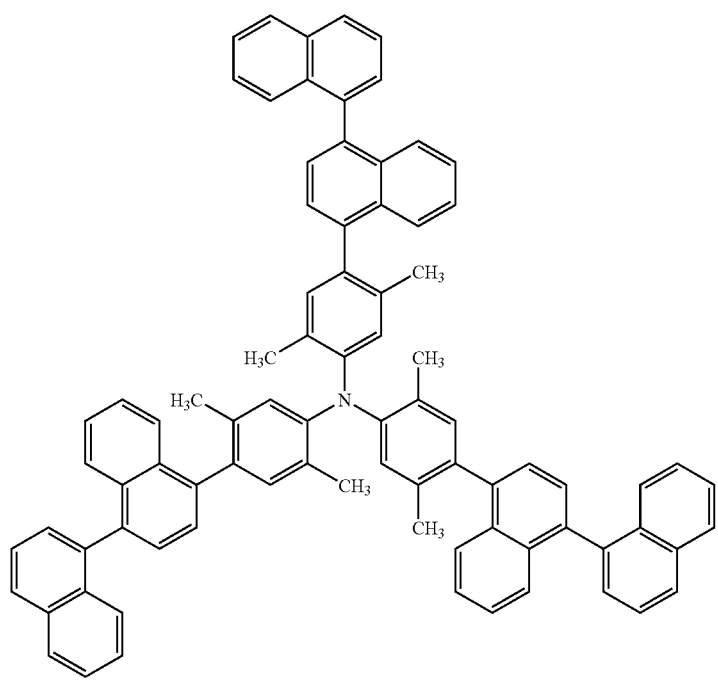
(30)
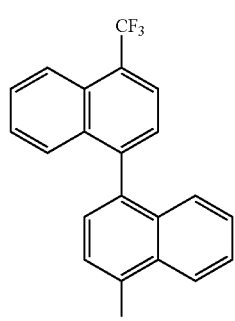

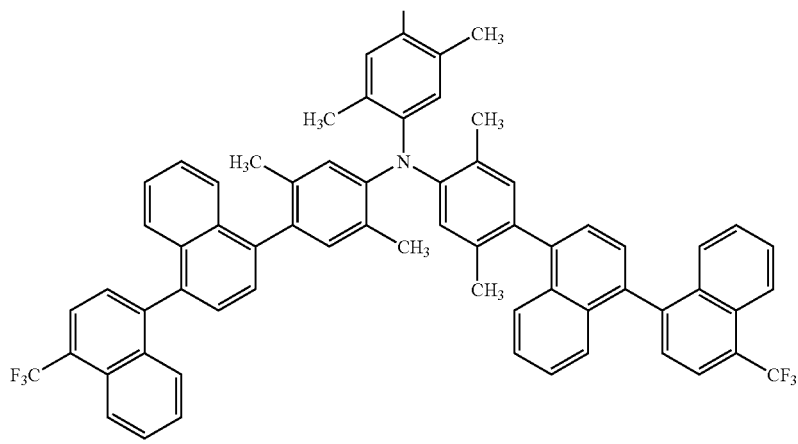
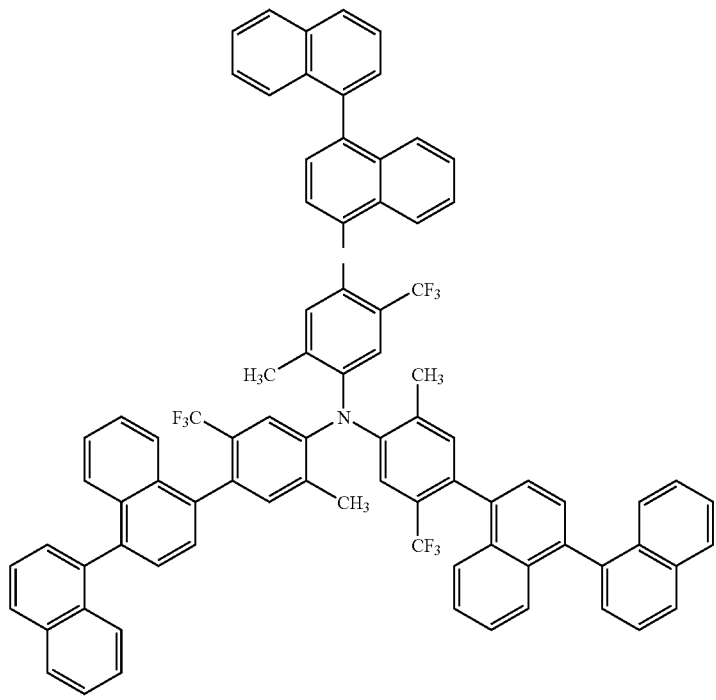
(31)
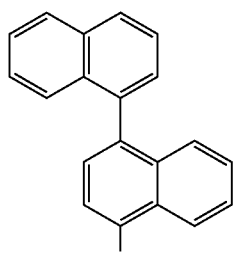
(32)

-continued
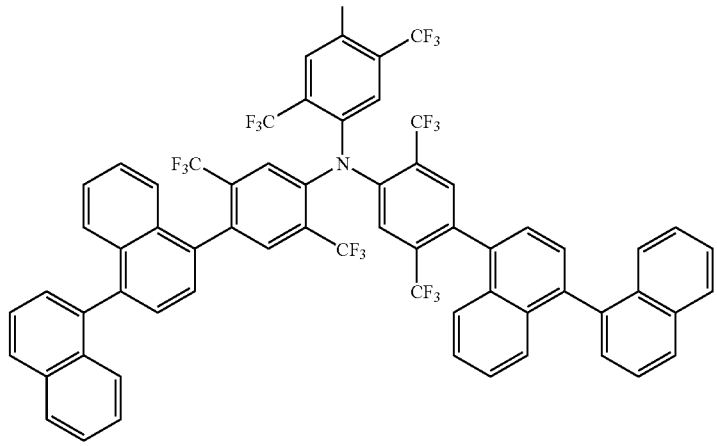
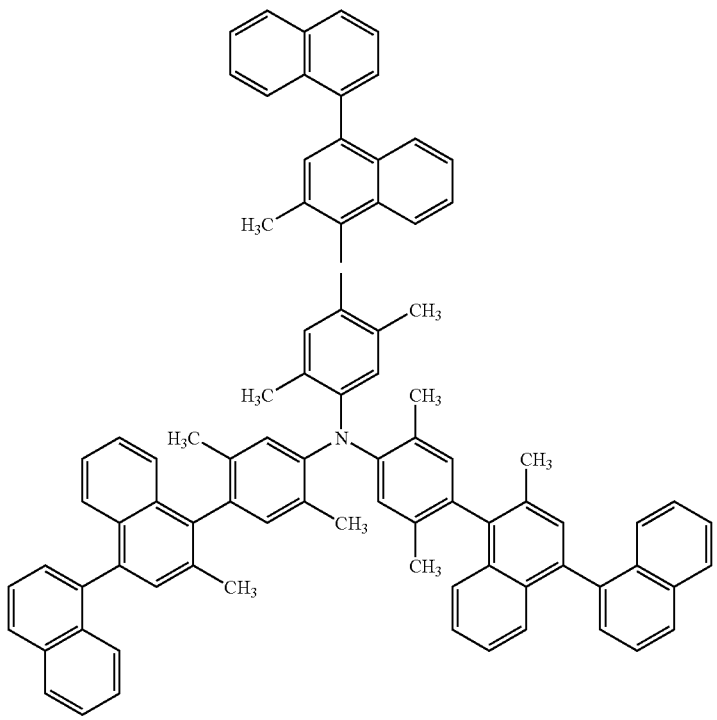
(33)
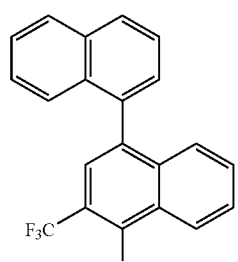
(34)

-continued
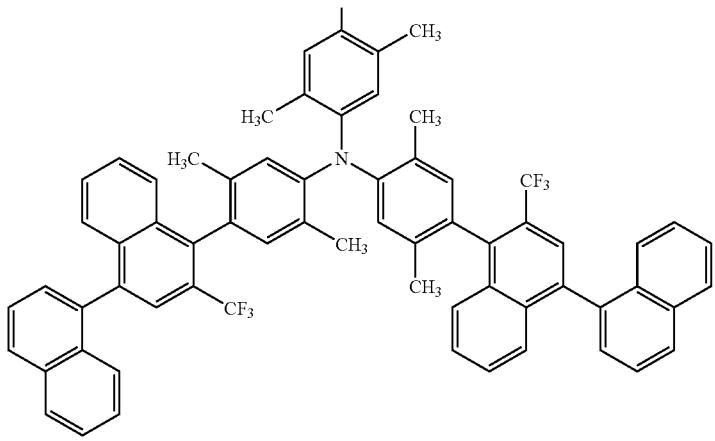
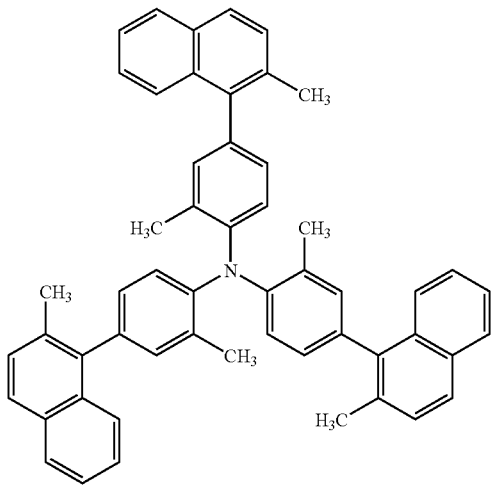
(35)
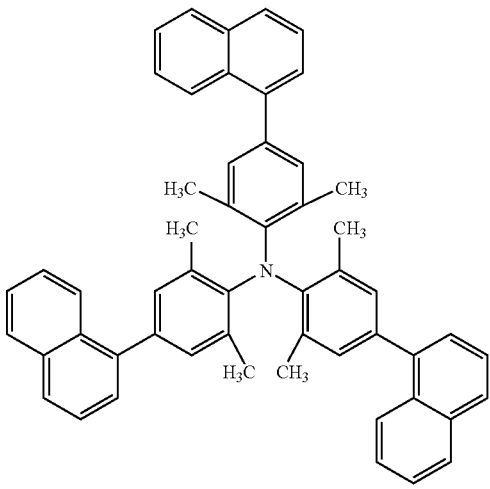
(36)
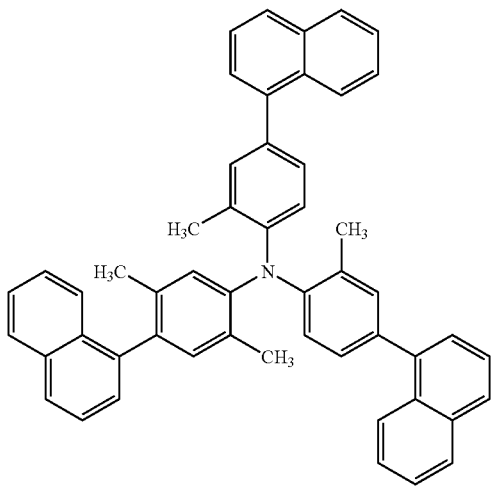
(37)
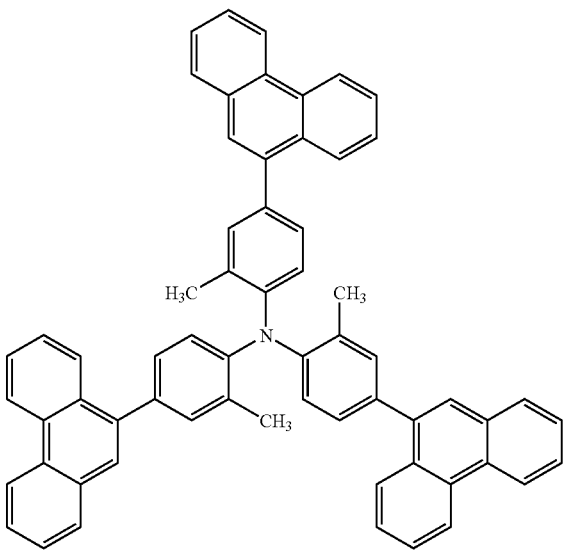
(38)

-continued
(39)
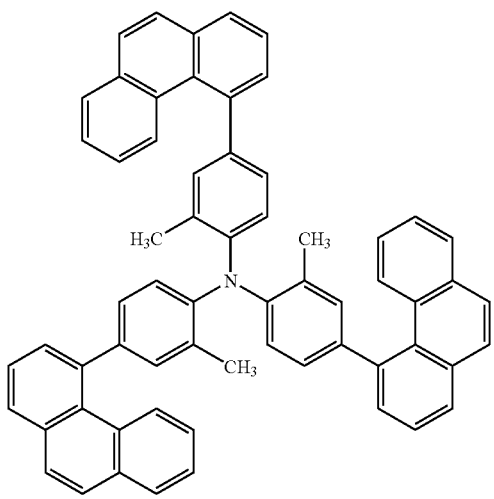
(40)
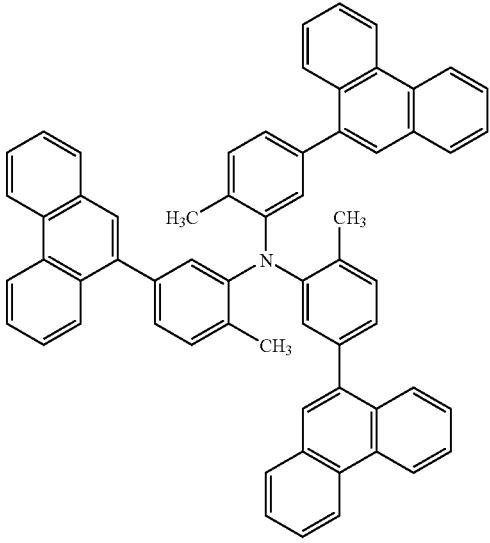
(41)
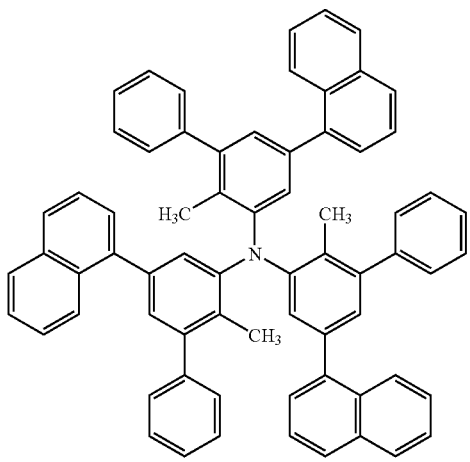
(42)
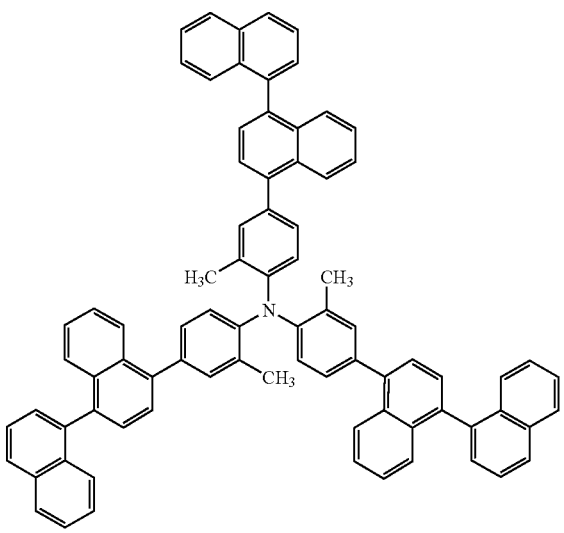
(43)
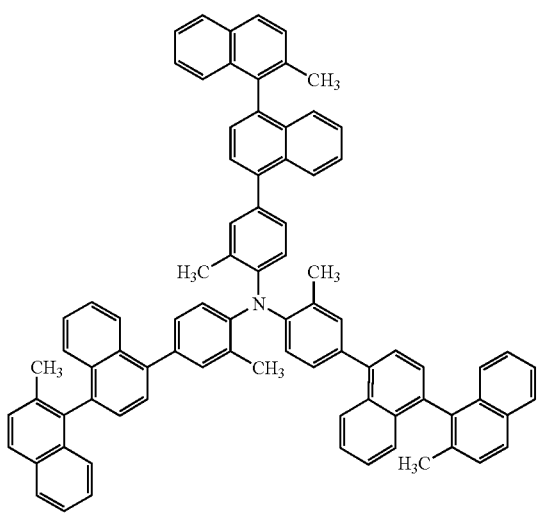
(44)
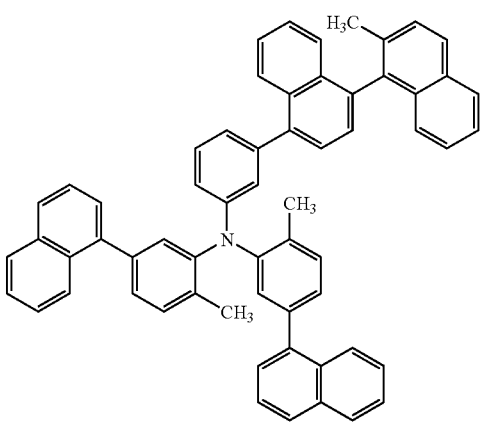

-continued
(45)
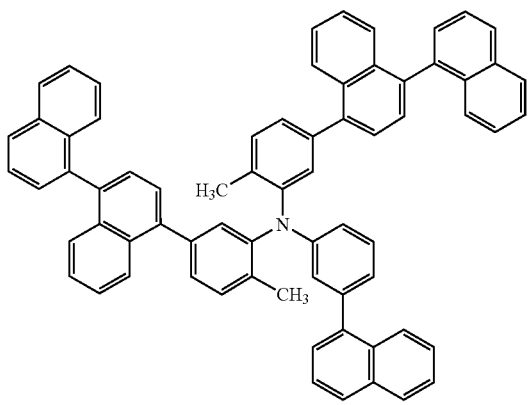
(46)
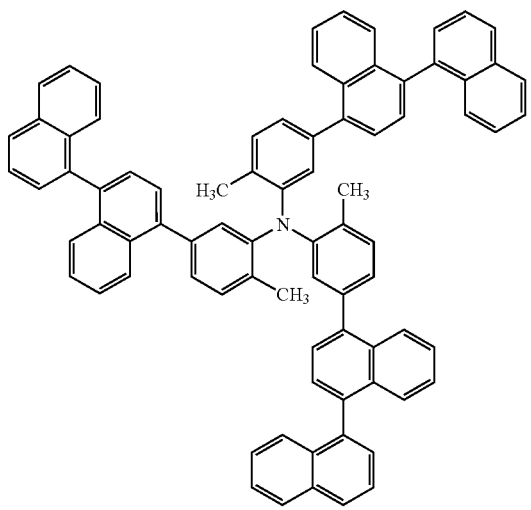
(47)
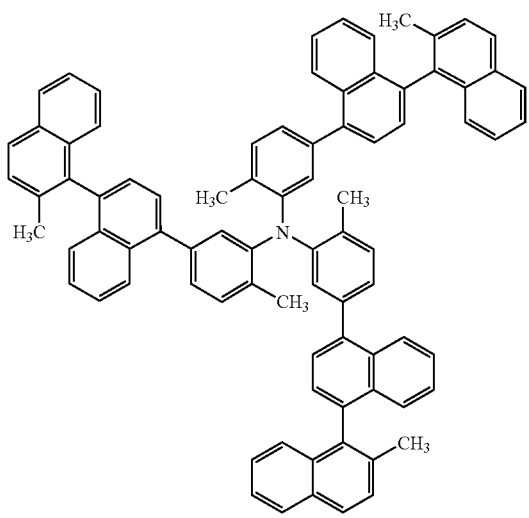
(48)
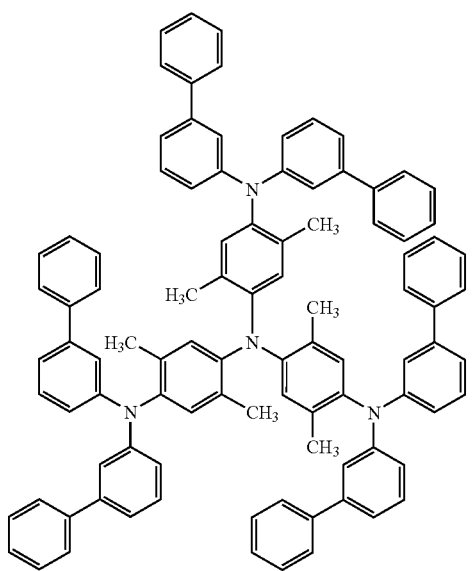
(49)
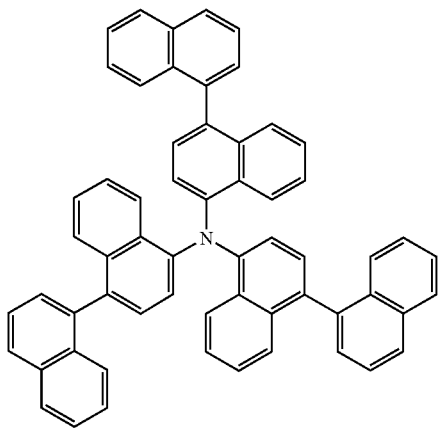
(50)
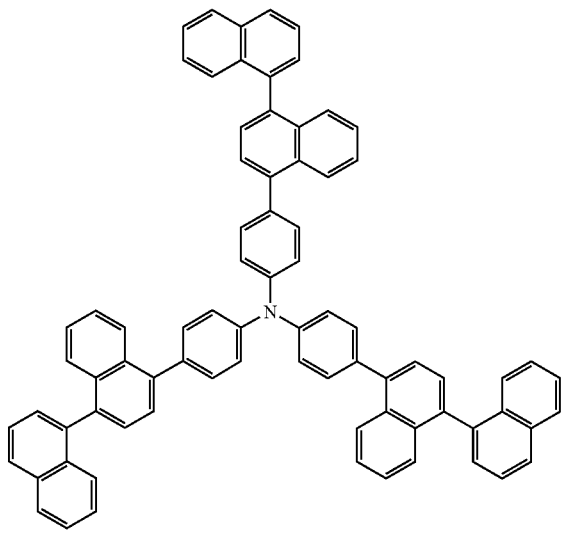

-continued
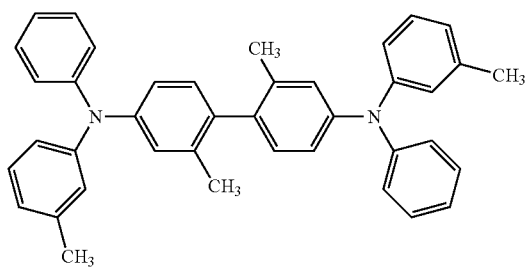
NT-1
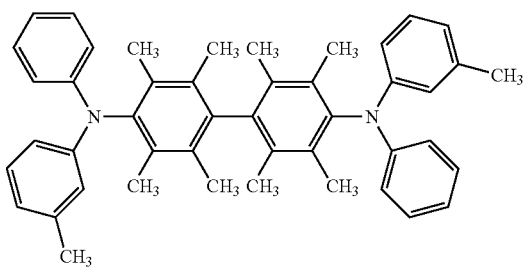
NT-2
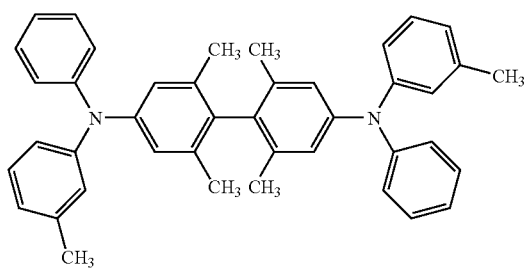
NT-3
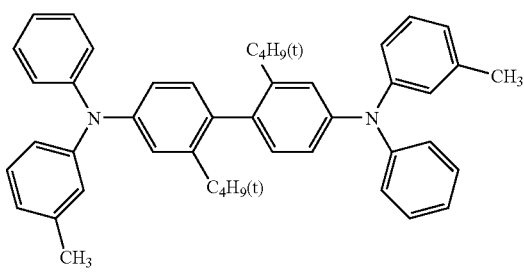
NT-4
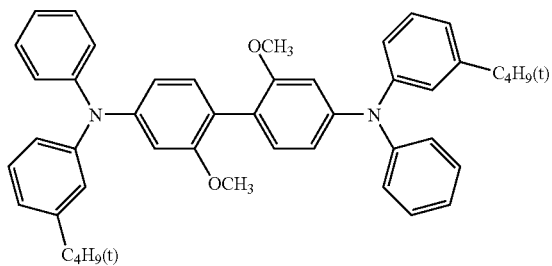
NT-5
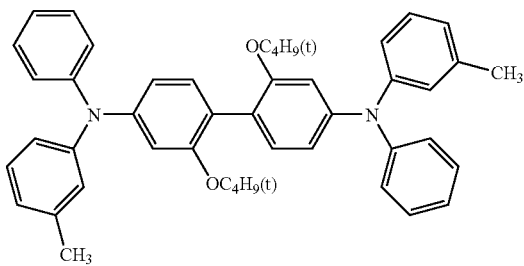
NT-6
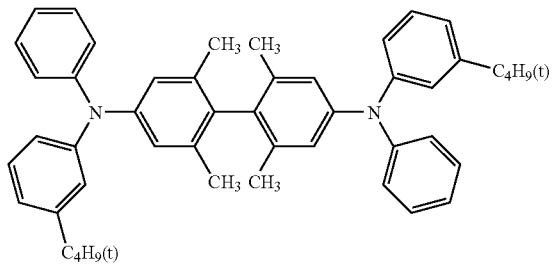
NT-7
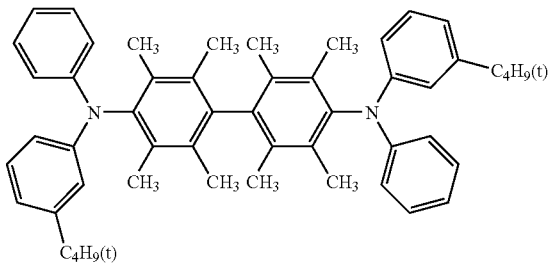
NT-8
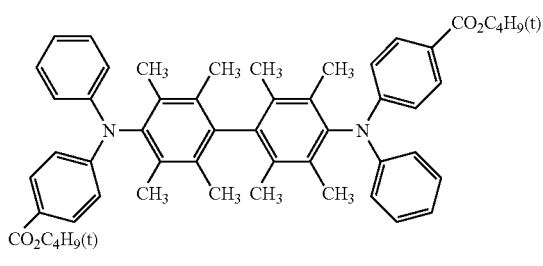
NT-9
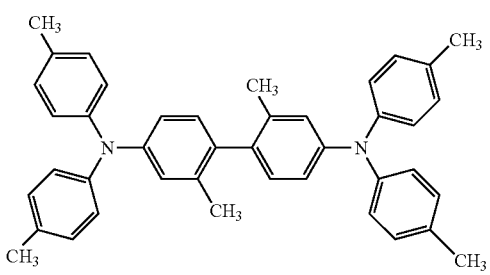
NT-10

-continued
NT-11
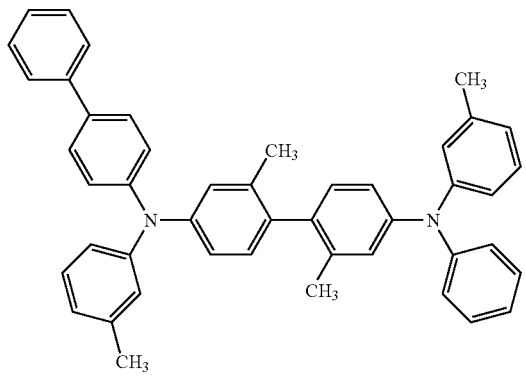
NT-12
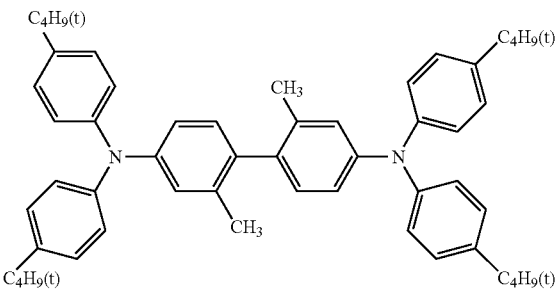
NT-13
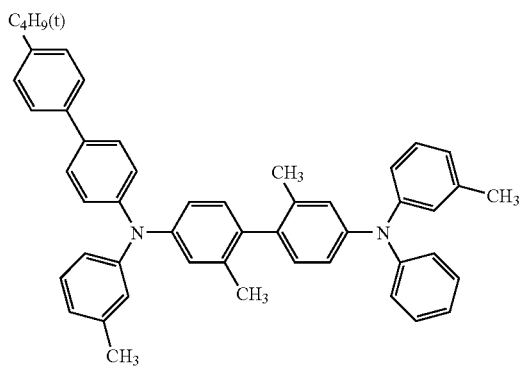
NT-14
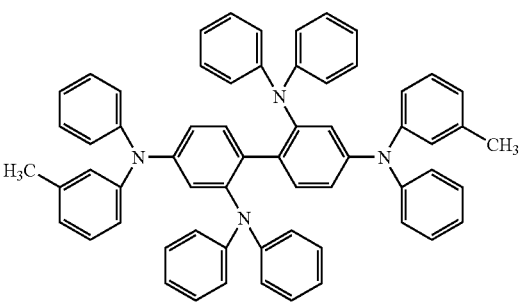
NT-15
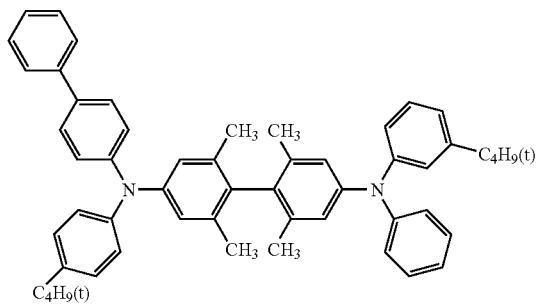
NT-16
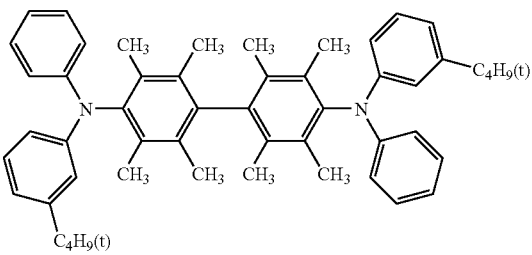
NT-17
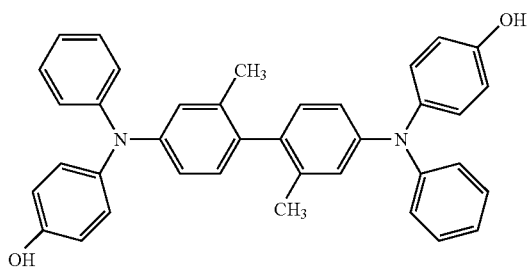
NT-18
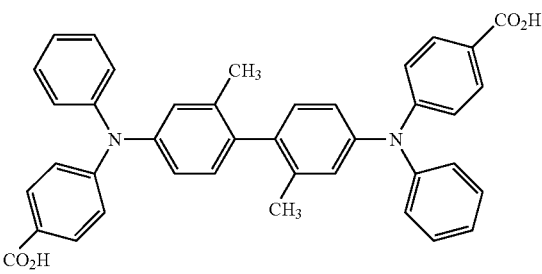

-continued
NT-19
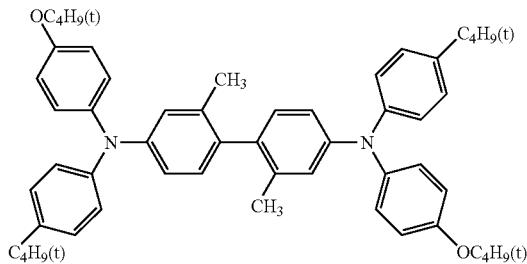
NT-20
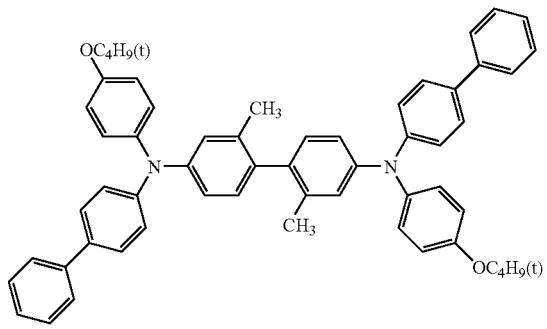
NP-1
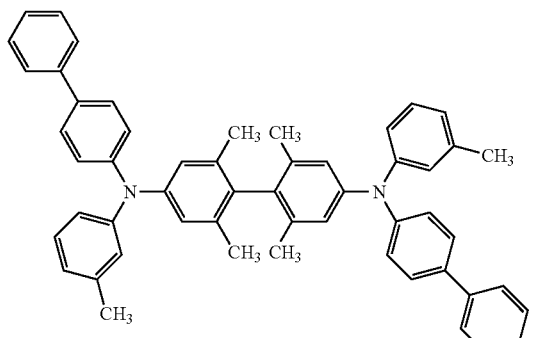
NP-2
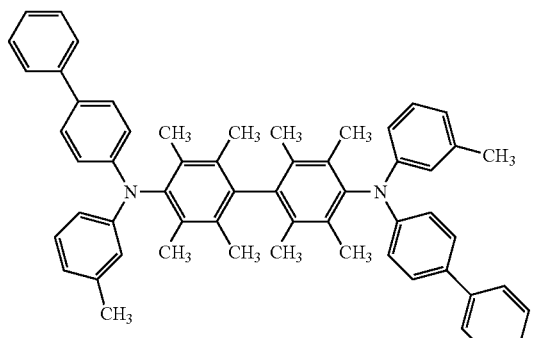
NP-3
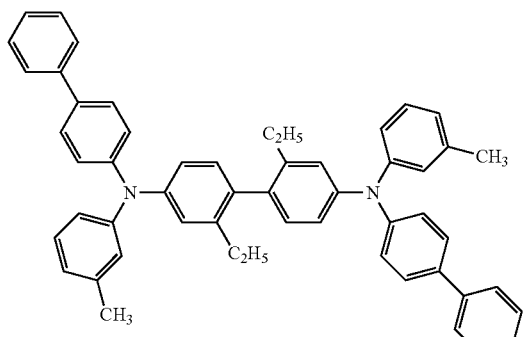
NP-4
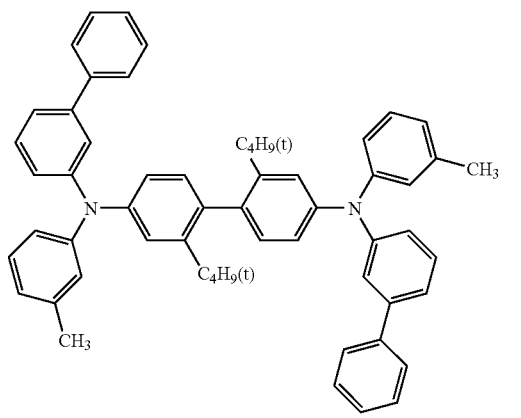
NP-5
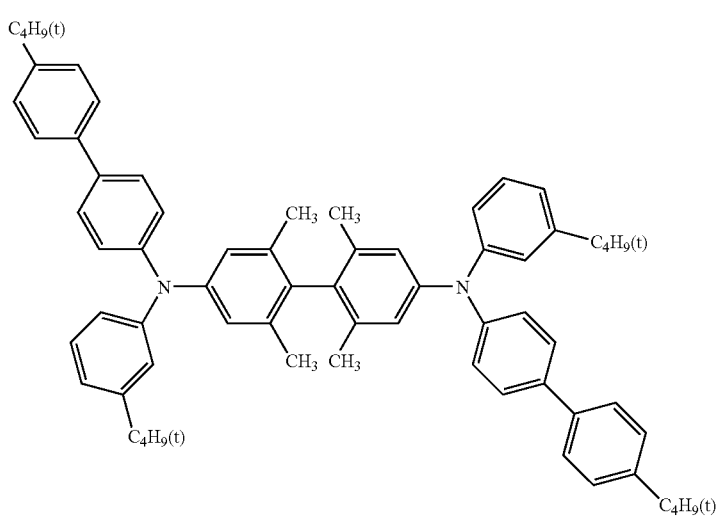

-continued
NP-6
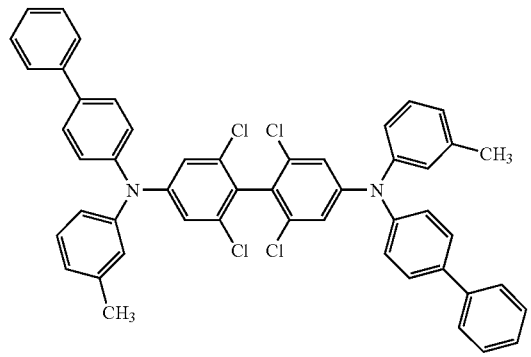
NP-7
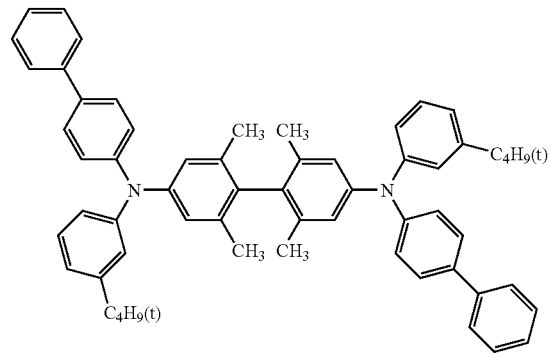
NP-8
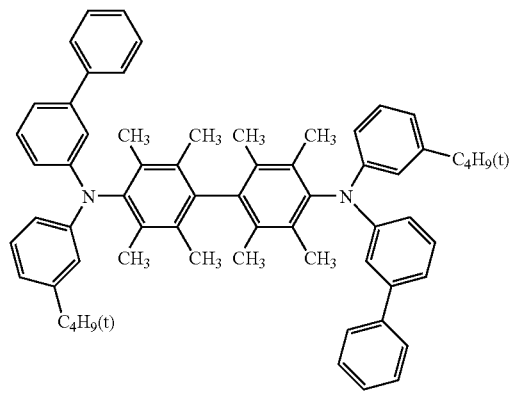
NP-9
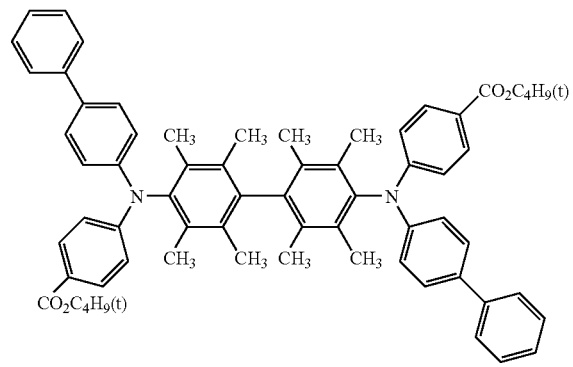
NP-10
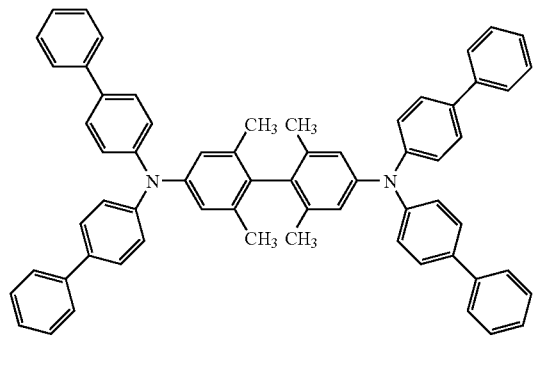
NP-11
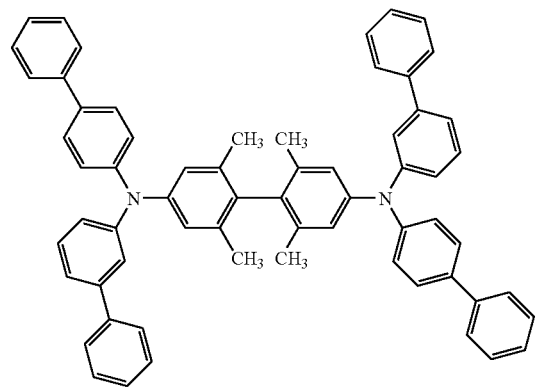
NP-12
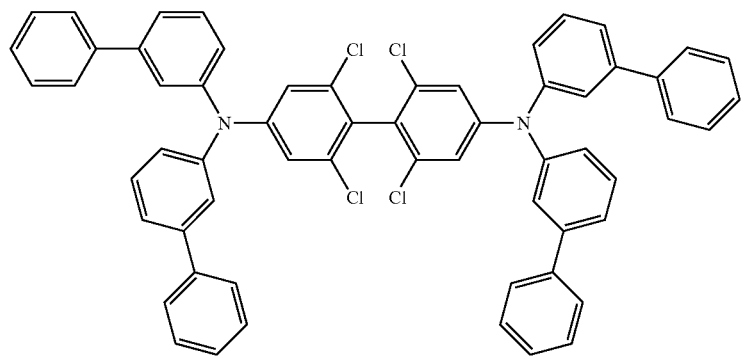

-continued
NP-13
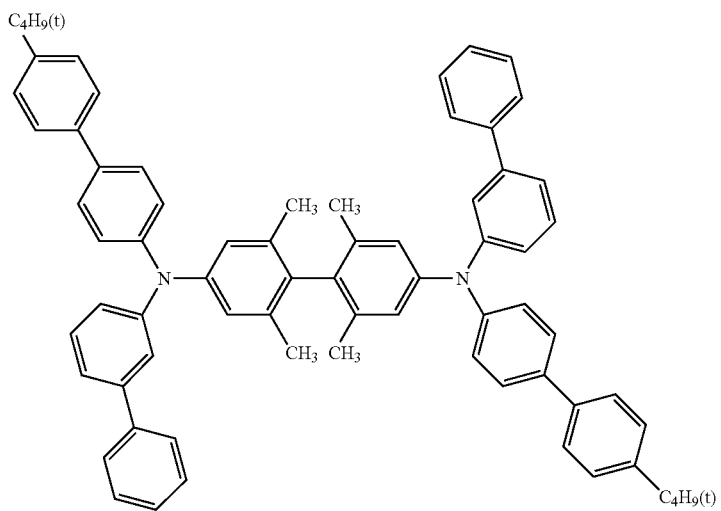
NP-14
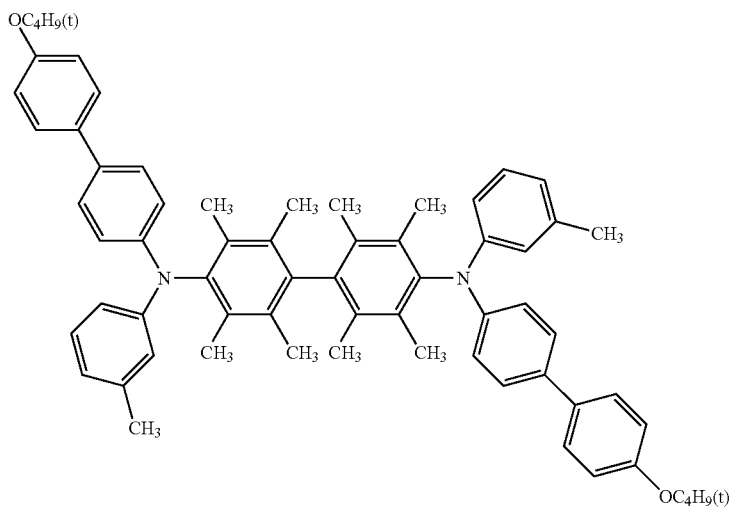
NP-15
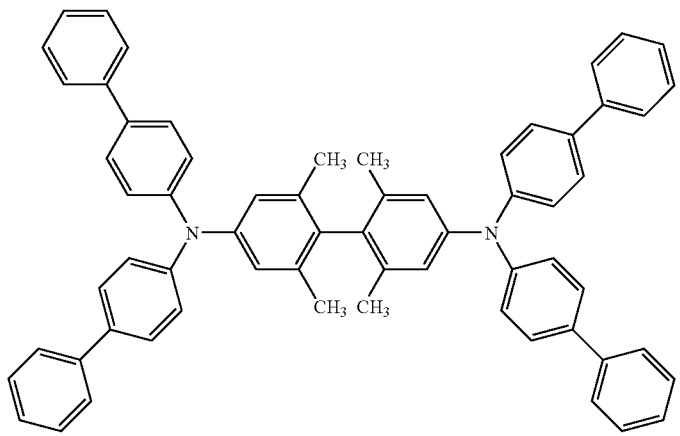

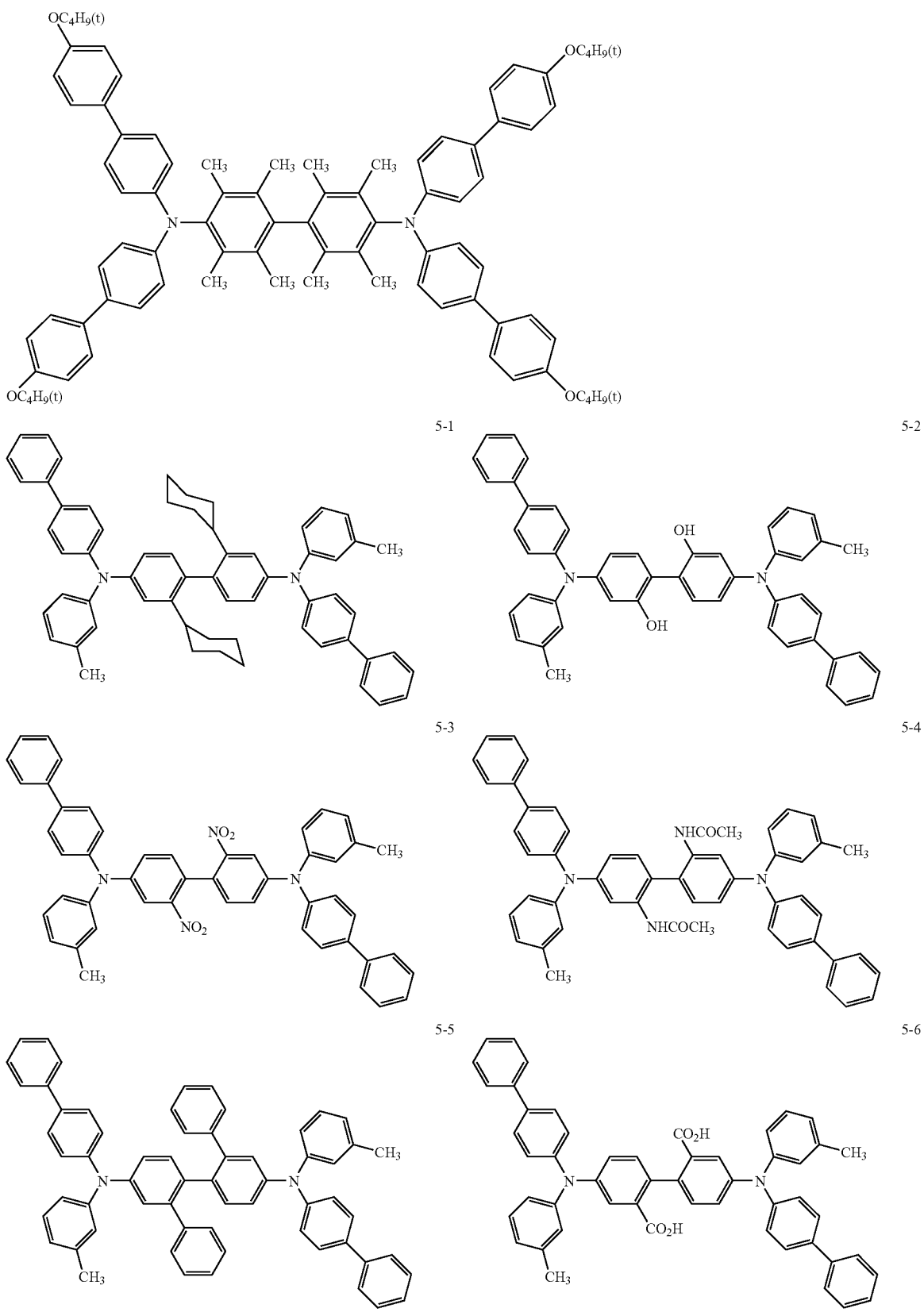

5-7
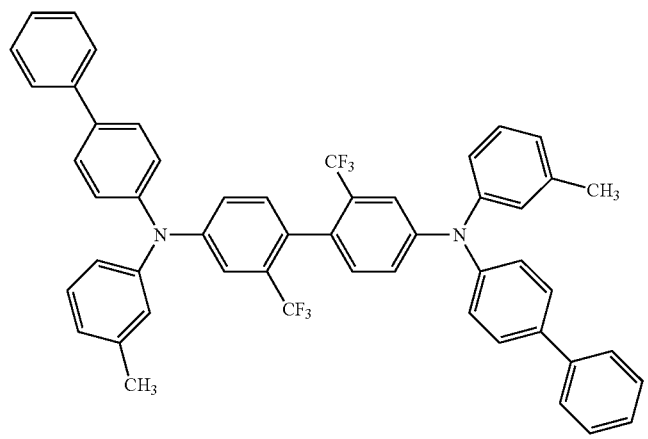
5-8
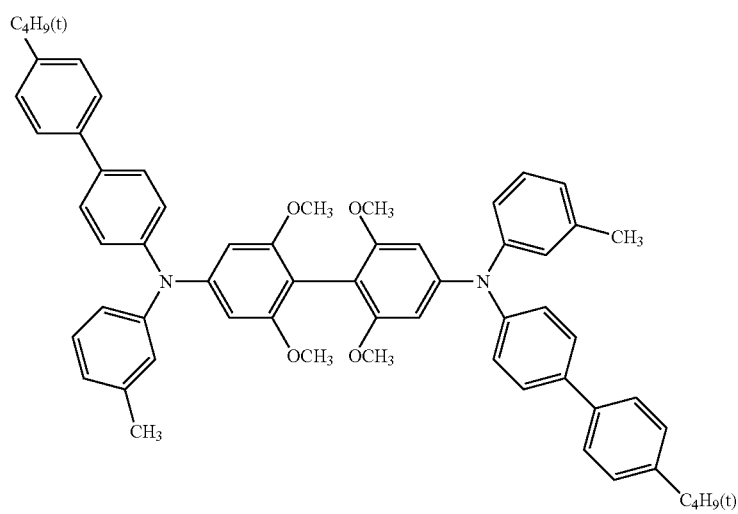
5-9
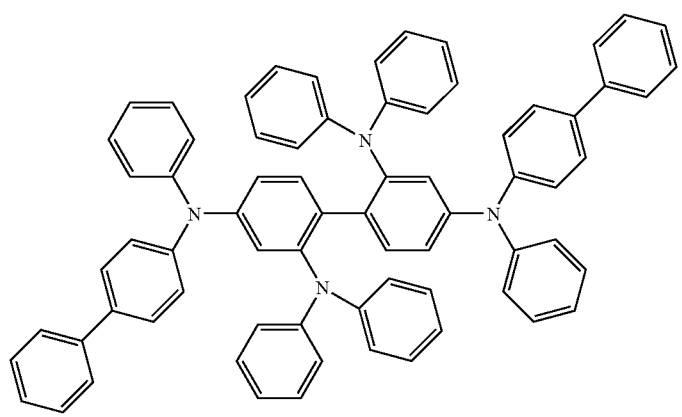

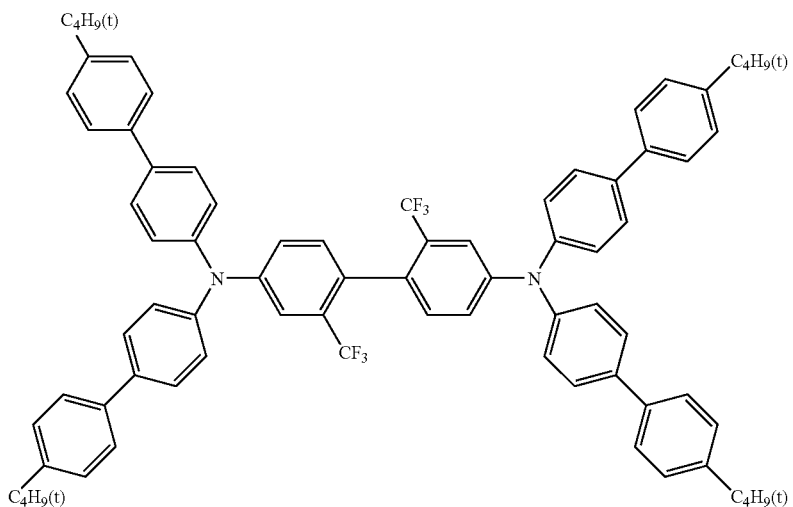
5-10
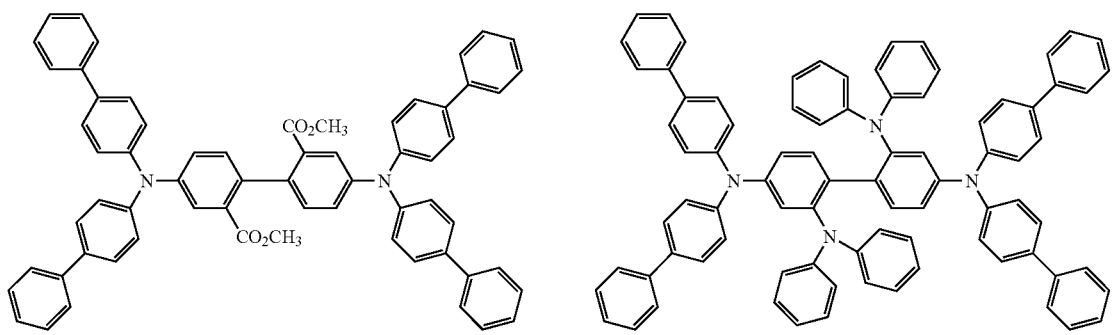
5-11  5-12
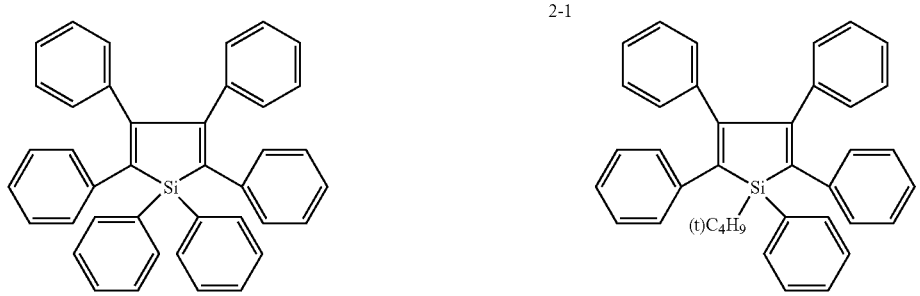
2-1  2-2
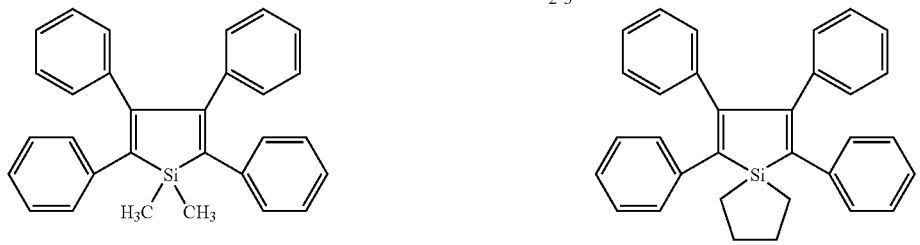
2-3  2-4

-continued 2-5

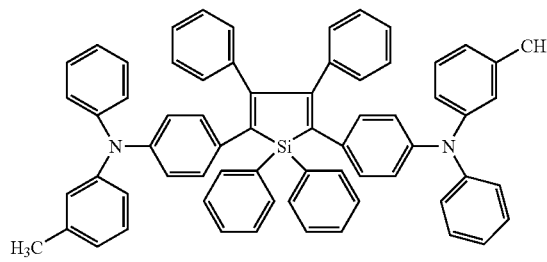

2-6

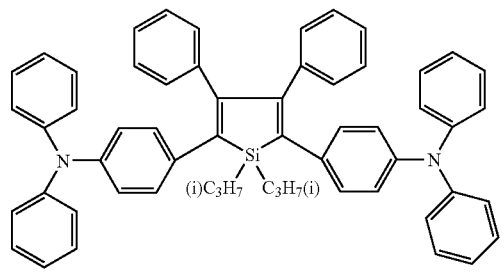

Besides the compounds represented by formulae (I) through (V) above, compounds having a nitrogen atom number-to-carbon atom number ratio (N/C) in the molecule of from 0 to 0.05, which can be used in the invention, include the following exemplified compounds.

1-1

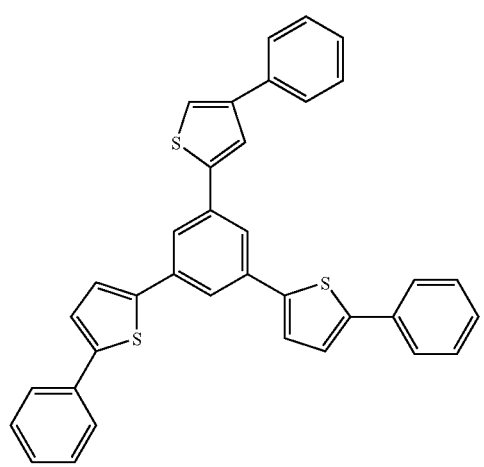

1-2

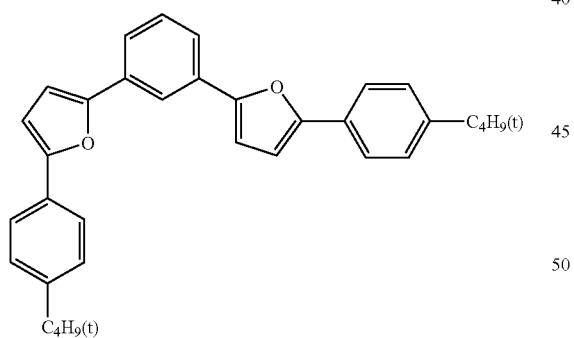

1-3

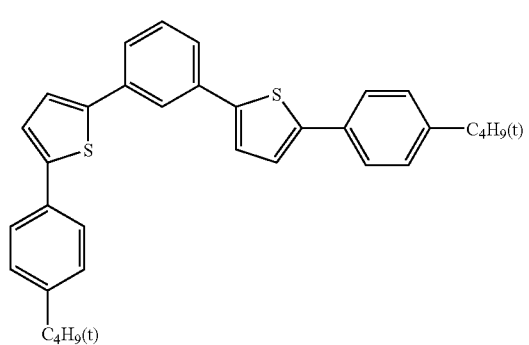

-continued 1-4

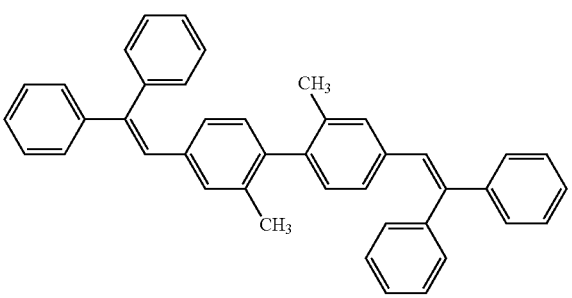

1-5

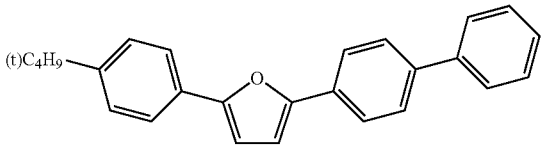

1-6

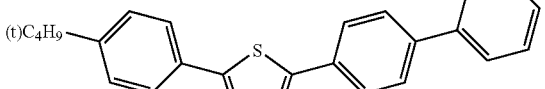

1-7

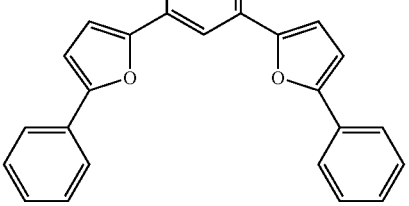
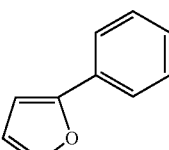

Color of light emitted from the fluorescent compound according to the invention is measured by a spectral light meter CS-1000, manufactured by Minolta Co., Ltd., and expressed according to CIE chromaticity diagram described in FIG. 4.16 on page 108 of "Shinpen Shikisai Kagaku Handbook" (Coloring Science Handbook, New Edition), edited by Nihon Shikisai Gakkai, published by Todai Shuppan Kai.

Compounds represented by formulae (I) through (V) have a high glass transition point (Tg), and therefore, provide high thermal stability as materials for an organic electroluminescence element. The Tg, which the compounds have, is preferably not less than 100° C.

The molecular weight of the compounds represented by formulae (I) through (V) is in the range of preferably from 600 to 5000. The compounds having the molecular weight of such a range can provide a light emission layer capable of being easily formed by an vacuum deposition method, and therefore, an organic EL element can be easily manufactured. Further, thermal stability of the fluorescent compound in the organic EL element is higher.

Layers such as a hole injecting layer, a hole transporting layer, an electron injecting layer and an electron transporting layer other than the light emission layer, which constitute the organic EL element, will be explained below.

In the invention, a hole injecting layer or a hole transporting layer has a function of transporting the positive hole injected from the anode to the light emission layer. Many positive holes can be injected in a lower electric field by the presence of the hole injecting layer or the hole transporting layer between the anode and the light emission layer. Moreover, an element can be obtained which increases a light emission efficiency and has an excellent light emission ability, since the electrons injected into the light emission layer from the cathode, the electron injecting layer or the electron transporting layer are accumulated at the interface in the light emission layer by a barrier to electrons existing at the interface between the light emission layer and the hole injecting layer or the hole transporting layer.

The material for the hole injecting layer and the hole transporting layer (hereinafter referred to also as a hole injecting material and a hole transporting material, respectively) can be optionally selected from known materials without any limitation as far as they have a function capable of transporting the positive hole injected from the anode to the light emission layer. Such materials include those employed for hole transporting materials in conventional photoconductive elements or known materials used in the hole injecting layer or hole transporting layer of conventional EL elements.

The hole injecting material or the hole transporting material described above may be either an organic substance or an inorganic substance as long as it has a hole injecting ability, a hole transporting ability or an ability to form a barrier to electron. Examples of the hole injecting material or the hole transporting material include a triazole derivative, an oxadiazole derivative, an imidazole derivative, a polyarylalkane derivative, a pyrazoline derivative and a pyrazolone derivative, a phenylenediamine derivative, an arylamine derivative, an amino substituted chalcone derivative, an oxazole derivative, a styryl anthracene derivative, a fluorenone derivative, a hydrazone derivative, a stilbene derivative, a silazane derivative, an aniline copolymer, and an electroconductive oligomer particularly a thiophene oligomer. As the hole injecting material or the hole transporting material, those described above are used, but a porphyrin compound, an aromatic tertiary amine compound, or a styrylamine compound is preferably used, and an aromatic tertiary amine compound is more preferably used.

Typical examples of the aromatic tertiary amine compound and styrylamine compound include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2'-bis (4-di-p-tolylaminophenyl)propane, 1,1'-bis(4-di-p-tolylaminophenyl)cyclohexane, N,N,N',N'-tetra-p-tolyl-4,4'-diaminobiphenyl, 1,1'-bis(4-di-p-tolylaminophenyl)-4-phenylcyclohexane, bis(4-dimethylamino-2-methylphenyl)-phenylmethane, bis(4-di-p-tolylaminophenyl)-phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino) quardriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostyrylbenzene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in Japanese Patent O.P.I. Publication No. 4-308688 such as 4,4',4''-tris[N-(3-methylphenyl)-N-phenylamino]-triphenylamine (MTDATA) in which three triphenylamine units are bonded in a starburst form.

A polymer in which the material mentioned above is introduced in the polymer chain or a polymer having the material as the polymer main chain can be also used.

As the hole injecting material or the hole transporting material, inorganic compounds such as p-Si and p-SiC are usable. The hole injecting layer or hole transporting layer can be formed by layering the hole injecting material or the hole transporting material by a known method such as a vacuum deposition method, a spin coat method a casting method and an LB method. The thickness of the hole injecting layer or the hole transporting layer is not specifically limited, but is ordinarily from 5 nm to 5 µm. The hole injecting layer or the hole transporting layer may be composed of a single layer structure comprising one or two or more of the materials mentioned above, or of plural layers comprising the same composition or different composition.

An electron transporting layer which is provided according to necessity is a layer having a function of transporting electrons injected to the cathode to the light emission layer. The material for the electron transporting layer may be optionally selected from known compounds.

Examples of the material used in the electron transporting layer (hereinafter referred to also as electron transporting material) include a nitro-substituted fluorene derivative, a diphenylquinone derivative, a thiopyran dioxide derivative, a heterocyclic tetracarboxylic acid anhydride such as naphthaleneperylene, a carbodiimide, a fluorenylidenemethane derivative, an anthraquinodimethane an anthrone derivative, and an oxadiazole derivative. Moreover, a thiadiazole derivative which is formed by substituting the oxygen atom in the oxadiazole ring of the foregoing oxadiazole derivative with a sulfur atom, and a quinoxaline derivative having a quinoxaline ring known as an electron withdrawing group are usable as the electron transporting material.

A polymer in which the material mentioned above is introduced in the polymer chain or a polymer having the material as the polymer main chain can be also used.

A metal complex of an 8-quinolinol derivative such as aluminum tris-(8-quinolinol) ($Alq_3$), aluminum tris-(5,7-dichloro-8-quinolinol), aluminum tris-(5,7-dibromo-8-quinolinol), aluminum tris-(2-methyl-8-quinolinol), aluminum tris-(5-methyl-8-quinolinol), or zinc bis-(8-quinolinol) (Znq), and a metal complex formed by replacing the center metal of the foregoing complexes with another metal atom such as In, Mg, Cu, Ca, Sn, Ga or Pb, can be used as the electron transporting material. Furthermore, a metal free or metal-containing phthalocyanine, and a derivative thereof, in which the molecular terminal is replaced by a substituent such as an alkyl group or a sulfonic acid group, are also preferably used as the electron transporting material. The distyrylpyrazine derivative exemplified as a material for an light emission layer may preferably be employed as the electron transporting material. An inorganic semiconductor such as n-Si and n-SiC may also be used as the electron transporting material in a similar way as in the hole injecting layer or in the hole transporting layer.

The electron transporting layer can be formed by layering the compounds described above by a known method such as a vacuum deposition method, a spin coat method, a casting method and an LB method. The thickness of the electron transporting layer is not specifically limited, but is ordinarily from 5 nm to 5 µm. The electron transporting layer may be composed of a single layer structure comprising one or two or more of the materials mentioned above, or of plural layers comprising the same composition or different composition.

In the invention, the light emission layer contains the fluorescent compound, but a positive hole or electron transporting layer adjacent to the light emission layer may contain one or more kinds of fluorescent compounds having a maximum fluorescence wavelength in the same regions as the fluorescent compound as a host compound of the phosphorescent compound described above, whereby an emission efficiency of the EL element can be increased. The fluorescent compound, which may be contained in the hole or electron transporting layer, is a fluorescent compound having the maximum fluorescence wavelength in the region of from 350 to 440 nm, and preferably 390 to 410 nm, as the fluorescent compound contained in the light emission layer.

A substrate preferably employed for the organic electroluminescent element of the invention is not restricted to specific kinds of materials such as glass and plastic, as far as it is transparent. Examples of the substrate preferably employed used in the organic electroluminescent element of the invention include glass, quartz and light transmissible plastic film.

Examples of the light transmissible plastic film include films such as polyethyleneterephthalate (PET), polyethylenenaphthalate (PEN), polyethersulfone (PES), polyetherimide, polyetheretherketone, polyphenylenesulfide, polyarylate, polycarbonate (PC), cellulose triacetate (TAC), cellulose acetate propionate (CAP) and so on.

Preferable examples in the preparation of the organic EL element will be described below.

For one example, the preparation of the EL element having the foregoing constitution, Anode/Hole injecting layer/Hole transporting layer/Light emission layer/Electron transporting layer/Electron injecting layer/Cathode, will be described.

A thin layer of a desired material-for electrode such as a material for an anode is formed on a suitable substrate by a deposition or spattering method, so that the thickness of the layer is not more than 1 µm, and preferably within the range of from 10 to 200 nm to prepare the anode. Then the hole injecting layer, the hole transporting layer, the light emission layer, the electron transporting layer and the electron injecting layer, which constitute the element, are formed on the resulting anode in that order.

A buffer layer (an electrode interface layer) may be provided between the anode and the light emission layer or the hole injecting layer, or between the cathode and the light emission layer or the electron injecting layer.

The buffer layer is a layer provided between the electrode and an organic layer in order to reduce the driving voltage or to improve of light emission efficiency. As the buffer layer there are an anode buffer layer and a cathode buffer layer, which are described in "Electrode Material" page 123, Div. 2 Chapter 2 of "Organic EL element and its frontier of industrialization" (published by NTS Corporation, Nov. 30, 1998) in detail.

The anode buffer layer is described in Japanese Patent O.P.I. Publication Nos. 9-45479, 9-260062, and 8-288069 etc., and its examples include a phthalocyanine buffer layer represented by a copper phthalocyanine layer, an oxide buffer layer represented by a vanadium oxide layer, an amorphous carbon buffer layer, a polymer buffer layer employing an electroconductive polymer such as polyaniline (emeraldine), and polythiophene, etc.

The cathode buffer layer is described in Japanese Patent O.P.I. Publication Nos. 6-325871, 9-17574, and 9-74586, etc. in detail, and its examples include a metal buffer layer represented by a strontium or aluminum layer, an alkali metal compound buffer layer represented by a lithium fluoride layer, an alkali earth metal compound buffer layer represented by a magnesium fluoride layer, and an oxide buffer layer represented by an aluminum oxide or lithium oxide layer.

The buffer layer is preferably very thin and has a thickness of preferably from 0.1 to 100 nm depending on kinds of the material used.

A layer having another function may be provided if necessary in addition to the fundamental configuration layers as described above, for example a hole blocking layer may be added as described in Japanese Patent O.P.I. Publication Nos. 11-204258, and 11-204359, and on page 237 of "Organic EL element and its frontier of industrialization" (published by NTS Corporation, Nov. 30, 1998).

At least one of the cathode buffer layer and anode buffer layer may contain the compound in the invention, and may function as a light emission layer.

Electrodes of the organic EL element will be explained below. The electrodes consist of a cathode and an anode.

For the anode of the organic EL element, a metal, an alloy, or an electroconductive compound each having a high working function (not less than 4 eV), and mixture thereof are preferably used as the electrode material. Concrete examples of such an electrode material include a metal such as Au, and a transparent electroconductive material such as CuI, indium tin oxide (ITO), $SnO_2$, or ZnO.

The anode may be prepared by forming a thin layer of the electrode material according to a depositing or spattering method, and by forming the layer into a desired pattern according to a photolithographic method. When required precision of the pattern is not so high (not less than 100 µm), the pattern may be formed by depositing or spattering of the electrode material through a mask having a desired form. When light is emitted through the anode, the transmittance of the anode is preferably 10% or more, and the sheet resistivity of the anode is preferably not more than several hundred $\Omega/\square$. The thickness of the layer is ordinarily within the range of from 10 nm to 1 µm, and preferably from 10 to 200 nm, although it may vary due to kinds of materials used.

On the other hand, for the cathode, a metal (also referred to as an electron injecting metal), an alloy, and an electroconductive compound each having a low working function (not more than 4 eV), and a mixture thereof is used as the electrode material. Concrete examples of such an electrode material include sodium, sodium-potassium alloy, magnesium, lithium, a magnesium/copper mixture, a magnesium/silver mixture, a magnesium/aluminum mixture, magnesium/indium mixture, an aluminum/aluminum oxide ($Al_2O_3$) mixture, indium, a lithium/aluminum mixture, and a rare-earth metal. Among them, a mixture of an electron injecting metal and a metal higher in the working function than that of the electron injecting metal, such as the magnesium/silver mixture, magnesium/aluminum mixture, magnesium/indium mixture, aluminum/aluminum oxide ($Al_2O_3$) mixture or lithium/aluminum mixture, is suitable from the view point of the electron injecting ability and resistance to oxidation. The cathode can be prepared forming a thin layer of such an electrode material by a method such as a deposition or spattering method. The sheet resistivity as the cathode is preferably not more than several hundred $\Omega/\square$, and the thickness of the layer is ordinarily from 10 nm to 1 μm, and preferably from 50 to 200 nm. It is preferable in increasing the light emission efficiency that either the anode or the cathode of the organic EL element is transparent or semi-transparent.

A preparation method of the organic EL element will be explained below.

For formation of the thin layer, a vacuum deposition method is preferably used even though a spin coating method, a casting method and a deposition method can be used. The vacuum deposition method is preferable since a uniform layer can be formed and a pinhole is formed with difficulty. Although conditions of the vacuum deposition are different due to kinds of materials used, or an intended crystalline or association structure of the molecular deposited layer, the vacuum deposition is preferably carried out at a boat temperature of from 50° C. to 450° C., at a vacuum degree of from $10^{-6}$ to $10^{-3}$ Pa, at a deposition speed of from 0.01 to 50 nm/second, and at a substrate temperature of from −50 to 300° C., to form a layer thickness of from 5 nm to 5 μm.

As described above, on a suitable substrate, a thin layer of a desired electrode material such as an anode material is formed by a deposition or spattering method so that the thickness of the layer is not more than 1 μm, preferably within the range of from 10 to 200 nm to prepare the anode. Then the hole injecting layer, the hole transporting layer, the light emission layer and the electron transporting layer and the electron injecting layer are formed on the anode as described above. After formation of these layers, a thin layer comprising a material for cathode is formed thereon by, for example, a deposition method or spattering method so that the thickness is not more than 1 μm, and preferably from 50 to 200 nm, to provide the cathode. Thus a desired EL element is obtained. It is preferred that the layers from the hole injecting layer to the cathode are continuously formed under one time of vacuuming to prepare the organic EL element. Further, the organic EL element can be prepared in the reverse order, in which the cathode, the electron injecting layer, the light emission layer, hole injecting layer, and the anode are formed in that order. Light emission can be observed when a direct current with a voltage of from about 5 to 40 V is applied to the thus prepared organic EL element so that the polarity of the anode is positive and that of the cathode is negative. When the voltage is applied in the reverse polarity, no current is generated and light is not emitted at all. When an alternating voltage is applied, light is emitted only when the polarity of the anode is positive and that of the cathode is negative. The shape of the wave of the alternating current may be optionally selected.

EXAMPLES

The present invention will be explained in the following examples, but is not limited thereto.

Example 1

Electroluminescence element sample Nos. 1-1 through 1-22 were prepared according to the following procedures:

<Preparation of Organic EL Element Sample>

A pattern was formed on a substrate (manufactured by NH Technoglass Co., Ltd.) composed of a glass plate (100 mm×1000 mm×1.1 mm) and a 150 nm ITO (indium tin oxide) layer as an anode. Then the resulting transparent substrate having the ITO transparent electrode was subjected to ultrasonic washing in i-propyl alcohol and dried by a dry nitrogen gas and subjected to UV-ozone cleaning for 5 minutes.

Thus obtained transparent substrate was fixed on a substrate holder of a vacuum deposition apparatus available in the market. Further, 200 mg of α-NPD were put in a first resistive heating molybdenum boat, 200 mg of CBP were put in a second resistive heating molybdenum boat, 200 mg of bathocuproine (BC) were put in a third resistive heating molybdenum boat, 200 mg of Ir-1 (phosphorescent compound) were put in a fourth resistive heating molybdenum boat, and 200 mg of $Alq_3$ were put in a fifth resistive heating molybdenum boat, and the resulting boats were set in the vacuum deposition apparatus. Then the pressure in the vacuum tank was reduced to $4\times10^{-4}$ Pa, and the boat carrying α-NPD was heated to 220° C. by supplying an electric current to the boat so as to form a hole transporting layer having a thickness of 45 nm by depositing α-NPD onto the transparent substrate at a depositing speed of 0.1 nm/sec. Moreover, the boat carrying CBP and the boat carrying Ir-1 were heated to 220° C. by supplying an electric current to both boats so as to co-deposit the CBP at a depositing speed of 0.01 nm/sec and the Ir-1 at a depositing speed of 0.1 nm/sec onto the hole transporting layer to form a light emission layer of 20 nm. The temperature of the substrate at the time of the deposition was room temperature. Then the boat carrying BC was heated to 250° C. by supplying an electric current to the boat so as to deposit the BC onto the light emission layer at a depositing speed of 0.1 nm/sec to form an electron transporting layer of 10 nm which could function as a hole blocking layer. Further, the boat carrying $Alq_3$ was heated to 250° C. by supplying an electric current to the boat so as to deposit the $Alq_3$ onto the electron transporting layer at a depositing speed of 0.1 nm/sec to form an electron transporting layer of 40 nm. The temperature of the substrate at the time of the deposition was room temperature.

Next, the vacuum tank was opened, and a stainless steel mask having a rectangular hole was set on the electron transporting layer. Further, 3 g of magnesium was put in a molybdenum resistive heating boat and 0.5 g of silver was put in a tungsten basket for deposition. The boat and the basket were set in the vacuum tank. The pressure in the vacuum tank was reduced to $2\times10^{-4}$ Pa. Then the boat carrying magnesium was heated by supplying an electric current so as to deposit magnesium at a deposition speed of from 1.5 to 2.0 nm/sec. At this time, the basket carrying silver was simultaneously heated so as to deposit silver at a deposition speed of 0.1 nm/sec to form a counter electrode composed of a mixture of magnesium and silver. Thus a comparative organic EL element sample No. 1-1 was prepared.

Organic EL element sample Nos. 1-2 through 1-22 were prepared in the same manner as comparative organic EL element sample No. 1-1, except that CBP and the phosphorescent compound in the light emission layer were replaced with those as shown in Table 2.

The chemical structures of the compounds used above are shown below.

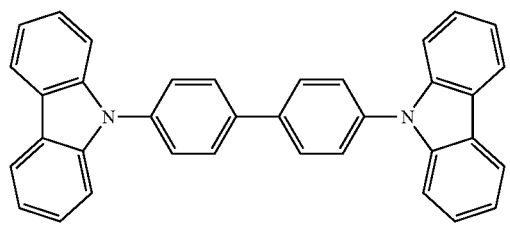

CBP

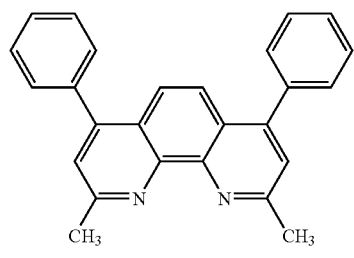

BC

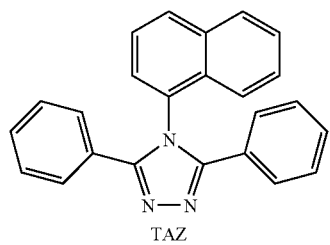

TAZ

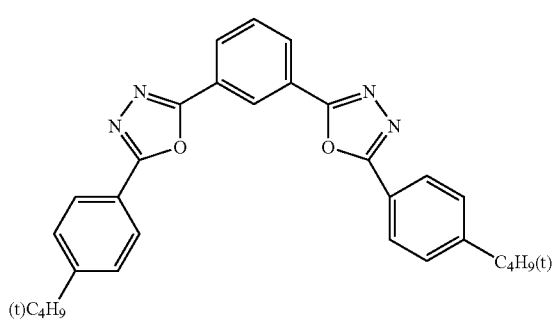

OXD7

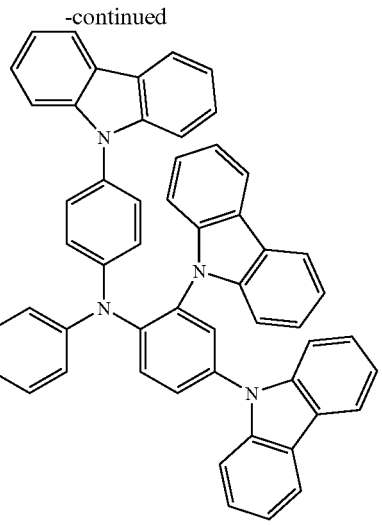

TPA

Alq3

α-NPD

<Evaluation of Luminance of Light Emitted from Organic EL Element Sample Nos. 1-1 Through 1-22>

When an initial driving voltage of 3V was applied to organic EL element sample No. 1-1, an electric current begins flowing and a light was emitted from the phosphorescent compound which was a dopant in the light emission layer. When a direct current voltage of 9V was applied to organic EL element sample No. 1-1 at 23° C. in an atmosphere of a dry nitrogen gas, luminance of light emitted from the sample 1-1 was measured according to CS-1000 produced Minolta Co., Ltd. The luminance of light emitted from the organic EL element sample Nos. 1-2 through 1-22 was expressed by a relative value when the luminance of light emitted from the organic EL element sample No. 1-1 was set at 100. The results are shown in Table 2.

TABLE 2

| Sample No. | Compound contained in light emission layer | N/C | Maximum flourescence wavelength (nm) | Molecular weight | Phosphorescent compound | Luminance of emitted light | Emission color | Remarks |
|---|---|---|---|---|---|---|---|---|
| 1-1 | CBP | 0.056 | 405 | 484 | Ir-1 | 100 | Green | Comp. |
| 1-2 | TAZ | 0.125 | 415 | 347 | Ir-1 | 138 | Green | Comp. |
| 1-3 | OXD7 | 0.2 | 375 | 478 | Ir-1 | 135 | Green | Comp. |
| 1-4 | BC | 0.077 | 398 | 360 | Ir-1 | 103 | Green | Comp. |
| 1-5 | TPA | 0.076 | 425 | 906 | Ir-1 | 86 | Green | Comp. |
| 1-6 | (1) | 0.0238 | 385 | 558 | Ir-1 | 163 | Green | Inv. |
| 1-7 | (6) | 0.0152 | 407 | 858 | Ir-1 | 180 | Green | Inv. |
| 1-8 | (7) | 0.0152 | 405 | 858 | Ir-1 | 180 | Green | Inv. |
| 1-9 | (9) | 0.0208 | 380 | 628 | Ir-1 | 171 | Green | Inv. |
| 1-10 | (38) | 0.0159 | 412 | 816 | Ir-1 | 175 | Green | Inv. |
| 1-11 | (48) | 0.0417 | 399 | 873 | Ir-1 | 155 | Green | Inv. |
| 1-12 | (1) | 0.0238 | 385 | 558 | Ir-2 | 161 | Green | Inv. |
| 1-13 | (6) | 0.0152 | 407 | 858 | Ir-3 | 168 | Green | Inv. |
| 1-14 | (7) | 0.0152 | 405 | 858 | Ir-5 | 175 | Green | Inv. |
| 1-15 | (9) | 0.0208 | 380 | 628 | Ir-8 | 188 | Green | Inv. |
| 1-16 | (38) | 0.0159 | 412 | 816 | Ir-9 | 185 | Red | Inv. |
| 1-17 | NT-1 | 0.05 | 385 | 825 | Ir-1 | 157 | Green | Inv. |
| 1-18 | NT-11 | 0.0435 | 402 | 831 | Ir-1 | 150 | Green | Inv. |
| 1-19 | NP-1 | 0.037 | 420 | 725 | Ir-1 | 153 | Green | Inv. |
| 1-20 | 5-5 | 0.0323 | 415 | 821 | Ir-1 | 158 | Green | Inv. |
| 1-21 | 1-1 | 0 | 430 | 553 | Ir-1 | 152 | Green | Inv. |
| 1-22 | 1-2 | 0 | 424 | 475 | Ir-1 | 155 | Green | Inv. |

Comp.: Comparative
Inv.: Inventive

As is apparent from Table 2 above, inventive organic electroluminescence element samples comprising a light emission layer containing the compounds in the invention emits light with high luminance. The inventive samples have proved to be useful for an organic EL element, and the following three are pointed out.

(1) The organic EL element employing the host compound having an N/C of not more than 0.05 (5%) provides high luminance. Further, when the host compound having an N/C of not more than 0.03 (3%) is employed, luminance is further increased.

(2) When a host compound having a maximum fluorescence wavelength in the wavelength regions of from 350 to 440 nm of the host compounds having an N/C of not more than 0.05 (5%) is employed, higher luminance is obtained.

(3) The host compound, having an N/C of not more than 0.05 (5%), a maximum fluorescence wavelength in the wavelength regions of from 350 to 440 nm, and a molecular weight of not less than 600, provides the highest luminance.

The phosphorescent quantum yields of phosphorescent compounds Ir-1, 2, 3, 5, 8, and 9 in 25° C. tetrahydrofuran was 0.36, 0.32, 0.27, 0.12, 0.34, and 0.21. respectively Herein, the maximum fluorescence wavelength of the fluorescent compound as a host compound is a wavelength giving the maximum fluorescent intensity in the fluorescent spectra of a 100 nm thick layer of the fluorescent compound deposited on a glass plate.

Example 2

Organic EL element sample Nos. 2-1 through 2-21 were prepared in the same manner as in organic EL element sample Nos. 1-1 through 1-21 in Example 1, respectively, except that α-NPD (having a maximum fluorescence wavelength of 452 nm) as a hole transporting material was replaced with m-MTDATXA (having a maximum fluorescence wavelength of 399 nm). The resulting element samples exhibited more increased luminance.

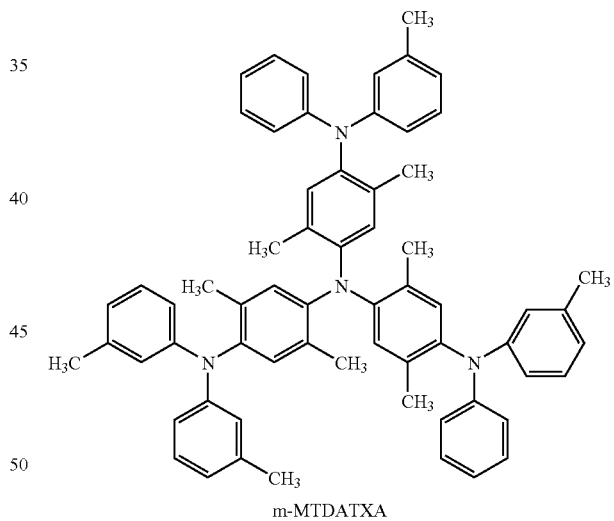

m-MTDATXA

Example 3

Organic EL element sample Nos. 3-1 through 3-21 were prepared in the same manner as in organic EL element sample Nos. 1-1 through 1-21 in Example 1, respectively, except that the cathode was replaced with Al, and a LiF-deposited cathode buffer layer with a thickness of 0.5 nm was provided between the cathode and the electron transporting layer. The luminance of emitted light from the sample was measured according to CS-1000 produced Minolta Co., Ltd. in the same manner as in Example 1. When the luminance of the organic EL element sample No. 1-8-was set at 100, the relative value of the luminance of the organic EL element sample No. 3-8 was 142. Similarly, introduction of the cathode buffer layer was proved to be effective in the other organic EL element samples prepared above.

Example 4

Organic EL element sample Nos. 4-1 and 4-2 were prepared in the same manner as in organic EL element sample Nos. 1-1 and 1-8 in Example 1, respectively, except that Ir-1 was replaced with Pt-3 {2,3,7,8,12,13,17,18-octa-ethyl-21H-Porphyrin platinum (II) (PtOEP), produced by Porphyrin Products Co., Ltd.}.

Organic EL element sample Nos. 4-3 and 4-4 were prepared in the same manner as in organic EL element sample Nos. 1-1 and 1-7 in Example 1, respectively, except that Ir-1 was replaced with Pt-2.

The luminance of emitted light from the resulting samples was measured, and as a result, the inventive samples employing the compound in the invention exhibited improved luminance.

A red light was emitted from the sample employing Pt-3, and a blue light was emitted from the sample employing Pt-2.

Example 5

Organic EL element sample No. 5-1 was prepared in the same manner as in Example 1, except that the light emission layer was replaced with a light emission layer having a thickness of 10 nm in which the respective five layers of a 1 nm thick layer containing fluorescent compound (7) and 1% by weight of DCM2 (light emission layer A) and a 1 nm thick layer containing compound (7) and 10% by weight of Ir-1 (light emission layer B) were alternately layered.

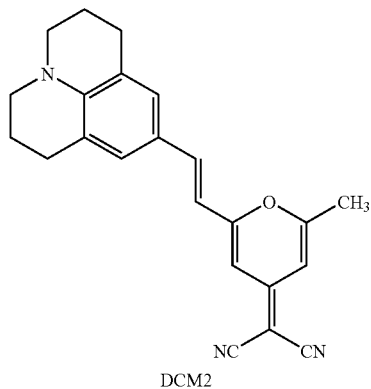

DCM2

A 590 nm light was emitted from DCM2 contained in the organic EL element sample No. 5-1.

Organic EL element sample No. 5-2 was prepared in the same manner as organic EL element sample No. 5-1 above, except that the fluorescent compound (7) was replaced with CBP. A 590 nm light was also emitted from DCM2 contained in the organic EL element sample No. 5-2, but its luminance was 0.60 times that of the organic EL element sample No. 5-1 employing the fluorescent compound (7). As is apparent from the above, the inventive sample provides higher luminance.

Example 6

The red light-emitting organic EL element, green light-emitting organic EL element, and blue light-emitting organic EL element prepared in Examples 1 and 4 were arranged on the same substrate, and a full color display as shown in FIG. 1 was prepared which employed an active matrix system.

FIG. 1 is a schematic drawing of a displaying section of the full color display prepared.

The displaying section A has a wiring portion including a plurality of scanning signal lines 5 and a plurality of data signal lines 6, and a plurality of pixels 3 (a red-light emitting pixel, a green-light emitting pixel and a blue-light emitting pixel, etc.) on the same substrate. The scanning signal lines 5 and the data signal lines 6 are composed of an electro-conductive material. The line 5 and the line 6 are crossed with each other at a right angle, and connected with the pixel 3 at the crossing position (not illustrated in detail). Organic EL elements corresponding to each of the plural pixels 3 described above are driven by an active matrix system in which a switching transistor as an active element and a driving transistor are provided to each of the organic EL elements. When the scanning signal is applied from the scanning signal line 5, the pixels 3 receive the image data signal from the data signal line 6, and emit light corresponding to the image data. A full color image can be displayed by suitably arranging the red-light emitting pixel, green light emitting pixel and blue light emitting pixel on the same substrate.

The full color display prepared above provided a full color moving image with high luminance and high visibility.

Example 7

Organic-EL element sample Nos. 7-1 through 7-22 were prepared in the same manner as comparative organic EL element sample No. 1-1 in Example 1, except that the compound contained in the light emission layer and the phosphorescent compound were replaced with those as shown in Table 3.

When a direct current voltage of 9V was applied to the resulting organic EL element samples at 23° C. in an atmosphere of a dry nitrogen gas, the half value period (emission lifetime) at which luminance of light emitted from the samples was reduced to half was measured. The half lifetime (emission lifetime) of light emitted from the organic EL element sample Nos. 7-2.through-7-22 was expressed by a relative value when the half lifetime (emission lifetime) of light emitted from the organic EL element sample No. 7-1 was set at 100. The luminance (cd/m$^2$) was measured according to CS-1000 produced Minolta Co., Ltd. The results are shown in Table 3.

TABLE 3

| Sample No. | Compound contained in light emission layer | N/C | Phosphorescent compound | Emission lifetime | Emission color | Remarks |
|---|---|---|---|---|---|---|
| 7-1 | *TPB | 0 | Ir-1 | 100 | Green | Comp. |
| 7-2 | **TCPB | 0.05 | Ir-1 | 92 | Green | Comp. |
| 7-3 | CBP | 0.056 | Ir-1 | 86 | Green | Comp. |
| 7-4 | TAZ | 0.125 | Ir-1 | 82 | Green | Comp. |
| 7-5 | OXD7 | 0.2 | Ir-1 | 94 | Green | Comp. |
| 7-6 | BC | 0.077 | Ir-1 | 56 | Green | Comp. |
| 7-7 | TPA | 0.076 | Ir-1 | 62 | Green | Comp. |
| 7-8 | (6) | 0.0152 | Ir-1 | 238 | Green | Inv. |
| 7-9 | (7) | 0.0152 | Ir-1 | 225 | Green | Inv. |
| 7-10 | (9) | 0.0208 | Ir-1 | 204 | Green | Inv. |
| 7-11 | (38) | 0.0159 | Ir-1 | 216 | Green | Inv. |
| 7-12 | (48) | 0.0417 | Ir-1 | 163 | Green | Inv. |
| 7-13 | (1) | 0.0238 | Ir-2 | 201 | Green | Inv. |
| 7-14 | (6) | 0.0152 | Ir-3 | 227 | Green | Inv. |
| 7-15 | (9) | 0.0208 | Ir-8 | 212 | Green | Inv. |

TABLE 3-continued

| Sample No. | Compound contained in light emission layer | N/C | Phosphorescent compound | Emission lifetime | Emission color | Remarks |
|---|---|---|---|---|---|---|
| 7-16 | (38) | 0.0159 | Ir-9 | 225 | Red | Inv. |
| 7-17 | NT-1 | 0.05 | Ir-1 | 101 | Green | Comp. |
| 7-18 | NT-11 | 0.0435 | Ir-1 | 162 | Green | Inv. |
| 7-19 | NP-1 | 0.037 | Ir-1 | 164 | Green | Inv. |
| 7-20 | 5-5 | 0.0323 | Ir-1 | 161 | Green | Inv. |
| 7-21 | 1-1 | 0 | Ir-1 | 102 | Green | Comp. |
| 7-22 | 1-2 | 0 | Ir-1 | 108 | Green | Comp. |

Comp.: Comparative
Inv.: Inventive
*TPB

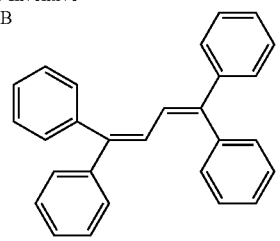

**TCPB

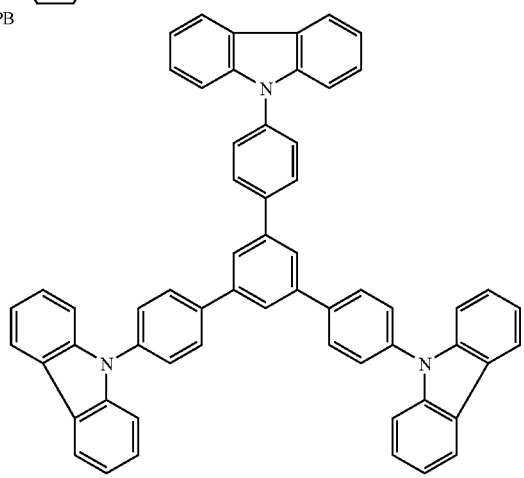

As is apparent from Table 3 above, inventive organic electroluminescence element samples comprising a light emission layer containing the host compound in the invention having an N/C of from more than 0 to less than 0.05 (5%) provides a longer half lifetime (emission lifetime), as compared with the comparative samples, and have proved to be useful for an organic EL element. Further, inventive organic electroluminescence element samples comprising a light emission layer containing the host compound in the invention having an N/C of from more than 0 to 0.03 (3%) provides a further longer half lifetime (emission lifetime), and have proved to be especially useful for an organic EL element.

EFFECT OF THE INVENTION

The present invention provides an organic electroluminescent element emitting light with high emission luminance, and a display employing the organic electroluminescent element which emits the light at reduced power consumption.

What is claimed is:

1. An organic electroluminescent element comprising a pair of electrodes and provided therebetween a light emission layer containing a first fluorescent compound and a phosphorescent compound, the first fluorescent compound having a nitrogen atom number to carbon atom number ratio in the molecule (N/C) of from more than 0 to less than 0.05, wherein the first fluorescent compound is represented by the following formula (I), (II), or (IV):

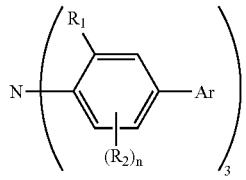

Formula (I)

wherein $R_1$ and $R_2$ independently represent a substituent; Ar represents an aromatic hydrocarbon ring or an aromatic heterocyclic ring, where each ring can have a substituent; and n is an integer from 0 to 3;

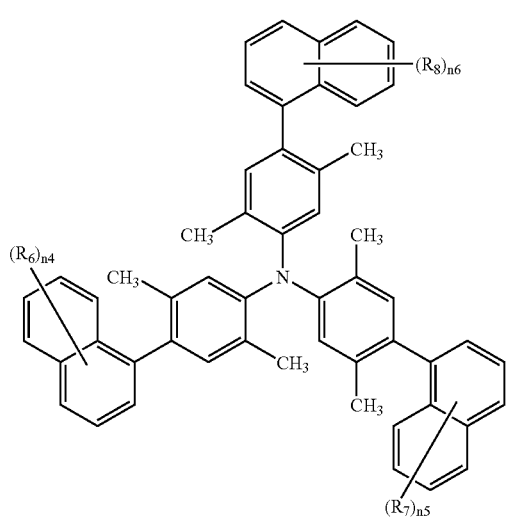

Formula (II)

wherein $R_6$, $R_7$ and $R_8$ independently represent a substituent selected from a halogen atom, an alkyl group, an alkoxy group, a cycloalkyl group, an aryl group, an aryloxy group and a heterocyclic group; and n4, n5 and n6 independently represent an integer from 0 to 7; or

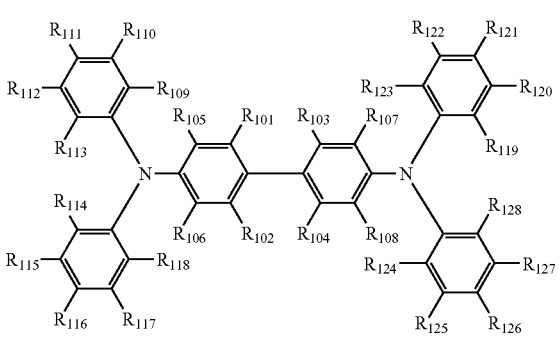

Formula (IV)

wherein $R_{101}$ through $R_{128}$ independently represent a hydrogen atom or a substituent, where at least one of $R_{101}$ through $R_{104}$ represents a substituent.

2. The organic electroluminescent element of claim 1, wherein the first fluorescent compound has a nitrogen atom number to carbon atom number ratio in the molecule (N/C) of from more than 0 to 0.03.

3. The organic electroluminescent element of claim 1, wherein the maximum fluorescence wavelength of the first fluorescent compound is in the range of from 350 to 440 nm.

4. The organic electroluminescent element of claim 1, wherein the molecular weight of the first fluorescent compound is not less than 600.

5. The organic electroluminescent element of claim 1, wherein the phosphorescent compound has a phosphorescent quantum yield of not less than 0.01 at 25° C. in tetrahydrofuran.

6. The organic electroluminescent element of claim 1, wherein a hole transporting layer containing at least one fluorescent compound or an electron transporting layer containing at least one fluorescent compound is provided adjacent to the light emission layer, the maximum fluorescence wavelength of the fluorescent compound contained in the hole transporting layer or in the electron transporting layer being in the range of from 350 to 440 nm.

7. The organic electroluminescent element of claim 1, wherein the maximum fluorescence wavelength of the first fluorescent compound is in the range of from 390 to 410 nm.

8. The organic electroluminescent element of claim 6, wherein the maximum fluorescence wavelength of the first fluorescent compound contained in the light emission layer and the fluorescent compound contained in the hole transporting layer or the electron transporting layer is in the range of from 390 to 410 nm.

9. The organic electroluminescent element of claim 1, wherein one of the pair of electrodes is a cathode, and at least one cathode buffer layer is provided between the light emission layer and the cathode.

10. The organic electroluminescent element of claim 1, wherein the phosphorescent compound is a heavy metal complex compound.

11. The organic electroluminescent element of claim 1, wherein the phosphorescent compound is a metal complex having a metal belonging to group VIII of the periodic table as a center metal.

12. The organic electroluminescent element of claim 1, wherein the phosphorescent compound is an osmium complex, an iridium complex or a platinum complex.

13. The organic electroluminescent element of claim 1, wherein the element further comprises a fluorescent compound having a maximum fluorescence wavelength in the region longer than a maximum phosphorescence wavelength of the phosphorescent compound.

14. A display comprising the organic electroluminescent element of any one of claims 2, 3, and 4 through 13.

15. A full color display comprising two of the organic electroluminescent element of any one of claims 2, 3, and 4 through 13, wherein the two elements are arranged on the same substrate, and emit light having a maximum emission wavelength different from each other.

16. The organic electroluminescent element of claim 1, wherein the substituent of $R_1$ and $R_2$ in Formula (I) independently is selected from a halogen atom, an alkyl group and an alkoxy group; and the substituent of $R_{101}$ through $R_{128}$ in Formula (IV) independently is selected from an alkyl group, an alkoxy group, a cycloalkyl group, an aralkyl group, an aryl group, an aryloxy group and an arylamino group.

* * * * *